United States Patent
Lof et al.

(10) Patent No.: US 8,558,989 B2
(45) Date of Patent: *Oct. 15, 2013

(54) LITHOGRAPHIC APPARATUS AND DEVICE MANUFACTURING METHOD

(75) Inventors: Joeri Lof, Eindhoven (NL); Erik Theodorus Maria Bijlaart, Rosmalen (NL); Hans Butler, Best (NL); Sjoerd Nicolaas Lambertus Donders, 'S-Hertogenbosch (NL); Christiaan Alexander Hoogendam, Veldhoven (NL); Aleksey Kolesnychenko, Nijmegen (NL); Erik Roelof Loopstra, Heeze (NL); Hendricus Johannes Maria Meijer, Veldhoven (NL); Jeroen Johannes Sophia Maria Mertens, Duizel (NL); Johannes Catharinus Hubertus Mulkens, Maastricht (NL); Roelof Aeilko Siebrand Ritsema, Eindhoven (NL); Frank Van Schaik, Eindhoven (NL); Timotheus Franciscus Sengers, 'S-Hertogenbosch (NL); Klaus Simon, Eindhoven (NL); Joannes Theodoor De Smit, Eindhoven (NL); Alexander Straaijer, Eindhoven (NL); Bob Streefkerk, Tilburg (NL); Helmar Van Santen, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 123 days.

This patent is subject to a terminal disclaimer.

(21) Appl. No.: 12/850,472

(22) Filed: Aug. 4, 2010

(65) Prior Publication Data

US 2011/0170077 A1    Jul. 14, 2011

Related U.S. Application Data

(60) Continuation of application No. 12/512,754, filed on Jul. 30, 2009, which is a division of application No. 11/710,408, filed on Feb. 26, 2007, now Pat. No. 7,593,093, which is a division of application No. 10/705,804, filed on Nov. 12, 2003, now Pat. No. 7,199,858.

(30) Foreign Application Priority Data

Nov. 12, 2002    (EP) ..................... 02257822
Jun. 9, 2003      (EP) ..................... 03253636

(51) Int. Cl.
  *G03B 27/42*    (2006.01)
  *G03B 27/52*    (2006.01)

(52) U.S. Cl.
  USPC ............................ 355/53; 355/30

(58) Field of Classification Search
  USPC ........ 355/55, 53, 30, 63, 72, 75, 77; 250/548, 250/492.2; 359/380
  See application file for complete search history.

(56) References Cited

U.S. PATENT DOCUMENTS 3,573,975 A    4/1971    Dhaka et al.
3,648,587 A    3/1972    Stevens (Continued)

FOREIGN PATENT DOCUMENTS

DE    206 607    2/1984
DE    221 563    4/1985

(Continued)

OTHER PUBLICATIONS

Information Disclosure Statement filed Dec. 1, 2006 for U.S. Appl. No. 11/606,913.

(Continued)

*Primary Examiner* — Peter B Kim
(74) *Attorney, Agent, or Firm* — Pillsbury Winthrop Shaw Pittman LLP

(57) ABSTRACT

A lithographic projection apparatus is disclosed in which a space between the projection system and the substrate is filled with a liquid. An edge seal member at least partly surrounds the substrate or other object on a substrate table to prevent liquid loss when edge portions of the substrate or other object are, for example, imaged or illuminated.

33 Claims, 10 Drawing Sheets

(56) References Cited

U.S. PATENT DOCUMENTS

| | | | |
|---|---|---|---|
| 4,346,164 A | 8/1982 | Tabarelli et al. |
| 4,358,198 A | 11/1982 | Moriyama et al. |
| 4,390,273 A | 6/1983 | Loebach et al. |
| 4,396,705 A | 8/1983 | Akeyama et al. |
| 4,465,368 A | 8/1984 | Matsuura et al. |
| 4,480,910 A | 11/1984 | Takanashi et al. |
| 4,509,852 A | 4/1985 | Tabarelli et al. |
| 4,999,669 A | 3/1991 | Sakamoto et al. |
| 5,040,020 A | 8/1991 | Rauschenbach et al. |
| 5,121,256 A | 6/1992 | Corle et al. |
| 5,229,872 A | 7/1993 | Mumola |
| 5,243,195 A | 9/1993 | Nishi |
| 5,296,891 A | 3/1994 | Vogt et al. |
| 5,523,193 A | 6/1996 | Nelson |
| 5,528,118 A | 6/1996 | Lee |
| 5,610,683 A | 3/1997 | Takahashi |
| 5,623,853 A | 4/1997 | Novak et al. |
| 5,633,968 A | 5/1997 | Sheem |
| 5,668,672 A | 9/1997 | Oomura |
| 5,689,377 A | 11/1997 | Takahashi |
| 5,715,039 A | 2/1998 | Fukuda et al. |
| 5,825,043 A | 10/1998 | Suwa |
| 5,835,275 A | 11/1998 | Takahashi et al. |
| 5,874,820 A | 2/1999 | Lee |
| 5,900,354 A | 5/1999 | Batchelder |
| 5,969,441 A | 10/1999 | Loopstra et al. |
| 5,985,495 A | 11/1999 | Okumura et al. |
| 6,046,792 A | 4/2000 | Van Der Werf et al. |
| 6,078,380 A | 6/2000 | Taniguchi et al. |
| 6,191,429 B1 | 2/2001 | Suwa |
| 6,236,634 B1 | 5/2001 | Lee et al. |
| 6,333,775 B1 | 12/2001 | Haney et al. |
| 6,560,032 B2 | 5/2003 | Hatano |
| 6,600,547 B2 | 7/2003 | Watson et al. |
| 6,603,130 B1 | 8/2003 | Bisschops et al. |
| 6,618,122 B2 | 9/2003 | Bisschops et al. |
| 6,633,365 B2 | 10/2003 | Suenaga |
| 6,650,399 B2 | 11/2003 | Baselmans et al. |
| 6,710,849 B2 | 3/2004 | Kwan et al. |
| 6,741,331 B2 | 5/2004 | Boonman et al. |
| 6,762,826 B2 | 7/2004 | Tsukamoto et al. |
| 6,785,006 B2 | 8/2004 | Nishida |
| 6,788,477 B2 | 9/2004 | Lin |
| 6,801,301 B2 | 10/2004 | Miyajima et al. |
| 6,867,844 B2 | 3/2005 | Vogel et al. |
| 6,952,253 B2 | 10/2005 | Lof et al. |
| 6,954,256 B2 | 10/2005 | Flagello et al. |
| 7,009,682 B2 | 3/2006 | Bleeker |
| 7,075,616 B2 | 7/2006 | Derksen et al. |
| 7,081,943 B2 | 7/2006 | Lof et al. |
| 7,098,991 B2 | 8/2006 | Nagasaka et al. |
| 7,199,858 B2 | 4/2007 | Lof et al. |
| 7,213,963 B2 | 5/2007 | Lof et al. |
| 7,227,616 B2 | 6/2007 | Graeupner |
| 7,388,648 B2 | 6/2008 | Lof et al. |
| 7,411,657 B2 | 8/2008 | Ottens et al. |
| 7,978,306 B2 | 7/2011 | Ottens et al. |
| 7,982,850 B2 | 7/2011 | Lof et al. |
| 8,154,708 B2 | 4/2012 | Lof et al. |
| 2002/0020821 A1 | 2/2002 | Van Santen et al. |
| 2002/0041377 A1 | 4/2002 | Hagiwara et al. |
| 2002/0061469 A1 | 5/2002 | Tanaka |
| 2002/0101574 A1 | 8/2002 | Tsuji |
| 2002/0118370 A1 | 8/2002 | Nishida |
| 2002/0163629 A1 | 11/2002 | Switkes et al. |
| 2002/0163630 A1 | 11/2002 | Bisschops et al. |
| 2002/0167642 A1 | 11/2002 | Jones et al. |
| 2002/0167651 A1 | 11/2002 | Boonman et al. |
| 2003/0030916 A1 | 2/2003 | Suenaga |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0109237 A1 | 6/2004 | Epple et al. |
| 2004/0114117 A1 | 6/2004 | Bleeker |
| 2004/0114124 A1 | 6/2004 | Hoeks et al. |
| 2004/0118184 A1 | 6/2004 | Violette |
| 2004/0119954 A1 | 6/2004 | Kawashima et al. |
| 2004/0123351 A1 | 6/2004 | Krautschik |
| 2004/0125351 A1 | 7/2004 | Krautschik |
| 2004/0135099 A1 | 7/2004 | Simon et al. |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0099635 A1 | 5/2005 | Kakuchi et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0122505 A1 | 6/2005 | Miyajima |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |

| | | | |
|---|---|---|---|
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Maria Zaal et al. | |
| 2005/0225734 A1 | 10/2005 | De Smit et al. | |
| 2005/0225737 A1 | 10/2005 | Weissenrieder et al. | |
| 2005/0231694 A1 | 10/2005 | Kolesnychenko et al. | |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0259234 A1 | 11/2005 | Hirukawa et al. | |
| 2005/0264778 A1 | 12/2005 | Lof et al. | |
| 2005/0270505 A1 | 12/2005 | Smith | |
| 2006/0103832 A1 | 5/2006 | Hazelton et al. | |
| 2006/0114445 A1 | 6/2006 | Ebihara | |
| 2006/0170891 A1 | 8/2006 | Nishinaga et al. | |
| 2006/0209414 A1 | 9/2006 | Van Santen et al. | |
| 2006/0261288 A1 | 11/2006 | Van Santen | |
| 2006/0285100 A1 | 12/2006 | Hamatani et al. | |
| 2007/0076181 A1 | 4/2007 | Ishii et al. | |
| 2007/0076182 A1 | 4/2007 | Hazelton et al. | |
| 2007/0132970 A1 | 6/2007 | Lof et al. | |
| 2007/0132979 A1 | 6/2007 | Lof et al. | |
| 2008/0278697 A1 | 11/2008 | Ottens et al. | |

FOREIGN PATENT DOCUMENTS

| | | | |
|---|---|---|---|
| DE | 224448 | 7/1985 | |
| DE | 242880 | 2/1987 | |
| EP | 0023231 | 2/1981 | |
| EP | 0418427 | 3/1991 | |
| EP | 0 605 103 A1 | 7/1994 | |
| EP | 0 834 773 A2 | 4/1998 | |
| EP | 1039511 | 9/2000 | |
| EP | 1 477 856 A1 | 11/2004 | |
| EP | 1 571 696 A1 | 9/2005 | |
| EP | 1 571 697 | 9/2005 | |
| EP | 1 571 701 | 9/2005 | |
| EP | 1 628 329 A1 | 2/2006 | |
| EP | 1 628 330 | 2/2006 | |
| FR | 2474708 | 7/1981 | |
| JP | A-57-153433 | 9/1982 | |
| JP | 58-202448 | 11/1983 | |
| JP | A 59-19912 | 2/1984 | |
| JP | 62-065326 | 3/1987 | |
| JP | 62-121417 | 6/1987 | |
| JP | 63-157419 | 6/1988 | |
| JP | 04-305915 | 10/1992 | |
| JP | 04-305917 | 10/1992 | |
| JP | A-5-62877 | 3/1993 | |
| JP | 5-251544 | 9/1993 | |
| JP | A-5-304072 | 11/1993 | |
| JP | 6-84757 A | 3/1994 | |
| JP | 06-124873 | 5/1994 | |
| JP | 6-168866 A | 6/1994 | |
| JP | 07-132262 | 5/1995 | |
| JP | 07-220990 | 8/1995 | |
| JP | A 08-316125 | 11/1996 | |
| JP | 09-066429 | 3/1997 | |
| JP | A-09-184787 | 7/1997 | |
| JP | 10-92728 | 4/1998 | |
| JP | 10-135316 | 5/1998 | |
| JP | 10-154659 | 6/1998 | |
| JP | A-10-160582 | 6/1998 | |
| JP | 10-228661 | 8/1998 | |
| JP | 10-255319 | 9/1998 | |
| JP | 10-303114 | 11/1998 | |
| JP | 10-340846 | 12/1998 | |
| JP | 11-126112 | 5/1999 | |
| JP | 11-176727 | 7/1999 | |
| JP | H11-239758 | 9/1999 | |
| JP | 2000-058436 | 2/2000 | |
| JP | A-2000-097616 | 4/2000 | |
| JP | 2000-331931 | 11/2000 | |
| JP | 2001-091849 | 4/2001 | |
| JP | A-2002-071513 | 3/2002 | |
| JP | A-2002-071514 | 3/2002 | |
| JP | 2002-513856 | 5/2002 | |
| JP | 2002-170754 | 6/2002 | |
| JP | A 2002-170765 | 6/2002 | |
| JP | 2002-246309 | 8/2002 | |
| JP | A-2002-250678 | 9/2002 | |
| JP | A-2002-296005 | 10/2002 | |
| JP | 2002-358556 | 12/2002 | |
| JP | 2003-332213 | 11/2003 | |
| JP | 2004-193252 | 7/2004 | |
| JP | 2005-12201 A | 1/2005 | |
| JP | 2005-277363 | 10/2005 | |
| WO | WO 98/33096 | 7/1998 | |
| WO | WO 98/38597 A2 | 9/1998 | |
| WO | WO 98/38597 A3 | 9/1998 | |
| WO | WO 98/40791 | 9/1998 | |
| WO | WO 99/49504 | 9/1999 | |
| WO | WO 99/060361 A1 | 11/1999 | |
| WO | WO 01/22480 A1 | 3/2001 | |
| WO | WO 02/090905 A2 | 11/2002 | |
| WO | WO 02/091078 A1 | 11/2002 | |
| WO | WO 03/077036 | 9/2003 | |
| WO | WO 03/077037 | 9/2003 | |
| WO | WO 03/085708 A1 | 10/2003 | |
| WO | WO 2004/019128 | 3/2004 | |
| WO | WO 2004/053596 A1 | 6/2004 | |
| WO | WO 2004/053950 A1 | 6/2004 | |
| WO | WO 2004/053951 A1 | 6/2004 | |
| WO | WO 2004/053952 A1 | 6/2004 | |
| WO | WO 2004/053953 A1 | 6/2004 | |
| WO | WO 2004/053954 A1 | 6/2004 | |
| WO | WO 2004/053955 A1 | 6/2004 | |
| WO | WO 2004/053956 A1 | 6/2004 | |
| WO | WO 2004/053957 A1 | 6/2004 | |
| WO | WO 2004/053958 A1 | 6/2004 | |
| WO | WO 2004/053959 A1 | 6/2004 | |
| WO | 2004/055803 A1 | 7/2004 | |
| WO | 2004/057589 A1 | 7/2004 | |
| WO | 2004/057590 A1 | 7/2004 | |
| WO | WO 2004/077154 A2 | 9/2004 | |
| WO | WO 2004/081666 A1 | 9/2004 | |
| WO | 2004/090577 | 10/2004 | |
| WO | 2004/090634 | 10/2004 | |
| WO | WO 2004/090633 A2 | 10/2004 | |
| WO | WO 2004/092830 A2 | 10/2004 | |
| WO | WO 2004/092833 A2 | 10/2004 | |
| WO | WO 2004/093130 A2 | 10/2004 | |
| WO | WO 2004/093159 A2 | 10/2004 | |
| WO | WO 2004/093160 A2 | 10/2004 | |
| WO | WO 2004/095135 A2 | 11/2004 | |
| WO | 2004/105107 | 12/2004 | |
| WO | 2004/112108 | 12/2004 | |
| WO | WO 2005/001432 A2 | 1/2005 | |
| WO | WO 2005/001572 A2 | 1/2005 | |
| WO | WO 2005/003864 A2 | 1/2005 | |
| WO | WO 2005/006026 A2 | 1/2005 | |
| WO | WO 2005/008339 A2 | 1/2005 | |
| WO | WO 2005/013008 A2 | 2/2005 | |
| WO | WO 2005/015283 A1 | 2/2005 | |
| WO | WO 2005/017625 A2 | 2/2005 | |
| WO | 2005/022616 | 3/2005 | |
| WO | WO 2005/019935 A2 | 3/2005 | |
| WO | WO 2005/022266 A2 | 3/2005 | |
| WO | WO 2005/024325 A2 | 3/2005 | |
| WO | WO 2005/024517 A2 | 3/2005 | |
| WO | WO 2005/034174 A2 | 4/2005 | |
| WO | WO 2005/050324 A2 | 6/2005 | |
| WO | WO 2005/054953 A2 | 6/2005 | |
| WO | WO 2005/054955 A2 | 6/2005 | |
| WO | WO 2005/059617 A2 | 6/2005 | |
| WO | WO 2005/059618 A2 | 6/2005 | |
| WO | WO 2005/059645 A2 | 6/2005 | |
| WO | WO 2005/059654 A1 | 6/2005 | |
| WO | WO 2005/062128 A2 | 7/2005 | |
| WO | WO 2005/064400 A2 | 7/2005 | |
| WO | WO 2005/064405 A2 | 7/2005 | |
| WO | WO 2005/069055 A2 | 7/2005 | |
| WO | WO 2005/069078 A1 | 7/2005 | |

(56) References Cited

FOREIGN PATENT DOCUMENTS

| WO | WO 2005/069081 A2 | 7/2005 |
|---|---|---|
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Information Disclosure Statement filed Dec. 1, 2006 for U.S. Appl. No. 11/606,909.
Office Action dated Apr. 6, 2007 issued for U.S. Appl. No. 11/606,913.
Office Action dated Nov. 6, 2006 issued for U.S. Appl. No. 11/002,900.
Office Action dated May 22, 2006 issued for U.S. Appl. No. 11/002,900.
Third Preliminary Amendment dated Aug. 17, 2005 for U.S. Appl. No. 11/147,285.
Office Action dated Sep. 29, 2008 issued for U.S. Appl. No. 11/606,909.
Office Action dated Dec. 28, 2007 issued for U.S. Appl. No. 11/606,913.
Office Action dated Sep. 17, 2007 issued for U.S. Appl. No. 11/002,900.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
EP Search Report for EP 02257938 dated Sep. 25, 2003.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
European Search Report dated May 3, 2004 for EP 03257068.1.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $\kappa_3$ coefficient in nonparaxial λ/NA scaling equations for resolution, depth of focus, and immersion lithography, *J. Microlith., Microfab., Microsyst.* 1(1):7-12 (2002).
European Search Report for EP 03 25 7068 completed Aug. 17, 2004.
Examination Report for Application No. 03 257 072.3 dated Mar. 28, 2008.
English language translation of Japanese Office Action issued in Japanese Patent Application No. 2004-169275 mailed Jul. 12, 2007.
Office Action in related application EP03 257 071.5 mailed Dec. 7, 2009.
U.S. Appl. No. 60/462,499, titled "Landing Pad for Immersion Lithography," filed Apr. 11, 2003 in the United States Patent and Trademark Office.
European Office Action dated Apr. 12, 2012 in corresponding European Patent Application No. 03 257 070.0.
U.S. Office Action mailed May 24, 2012 in corresponding U.S. Appl. No. 12/512,754.
U.S. Office Action mailed Jun. 8, 2012 in corresponding, U.S. Appl. No. 13/149,404.
U.S. Office Action mailed Jun. 14, 2012 in corresponding U.S. Appl. No, 12/698,938.
Japanese Office Action mailed Jul. 24, 2012 in corresponding Japanese Patent Application No. 2011-243516.
European Patent Office Communication dated Jan. 3, 2012 in corresponding European Patent Application No. 04 253 354.7.
Chinese Office Action dated Dec. 7, 2011 in corresponding Chinese Patent Application No. 200910002111.5.
Japanese Office Action mailed Nov. 6, 2012 in corresponding Japanese Patent Application No. 2011-243513.
U.S. Office Action mailed Nov. 26, 2012 in corresponding U.S. Appl. No. 12/698,938.
U.S. Office Action mailed Sep. 27, 2012 in corresponding U.S. Appl. No. 12/698,932.
U.S. Office Action mailed Oct. 24, 2012 in corresponding U.S. Appl. No. 12/512,754.
U.S. Office Action mailed Oct. 15, 2012 in corresponding U.S. Appl. No. 13/149,404.
Chinese Notification of Completion of Formalities for Registration dated Jul. 1, 2013 in corresponding Chinese Patent Application No. 201110083335.0.
Japanese Office Action mailed Jun. 12, 2013 in corresponding Japanese Patent Application No. 2012-027270.

(56) References Cited

OTHER PUBLICATIONS

Japanese Office Action mailed May 31, 2013 in corresponding Japanese Patent Application No. 2011-281445.
U.S. Office Action dated Jun. 20, 2013 in corresponding U.S. Appl. No. 12/512,754.
U.S. Office Action dated May 28, 2013 in corresponding U.S. Appl. No. 13/149,404.
U.S. Office Action dated Apr. 19, 2013 in corresponding U.S. Appl. No. 13/306,532.
U.S. Office Action dated Aug. 8, 2013 in corresponding U.S. Appl. No. 13/195,248.
U.S. Office Action dated Aug. 8, 2013 in corresponding U.S. Appl. No. 13/194,136.
U.S. Office Action dated Aug. 9, 2013 in corresponding U.S. Appl. No. 13/306,532.

LITHOGRAPHIC APPARATUS AND DEVICE MANUFACTURING METHOD

This application is a continuation application of U.S. patent application Ser. No. 12/512,754, entitled "Lithographic Apparatus And Device Manufacturing Method", filed on Jul. 30, 2009, which is a divisional application of U.S. patent application Ser. No. 11/710,408, entitled "Lithographic Apparatus And Device Manufacturing Method", filed on Feb. 26, 2007, now U.S. Pat. No. 7,593,093, which is a divisional application of U.S. patent application Ser. No. 10/705,804, filed Nov. 12, 2003, now U.S. Pat. No. 7,199,858, which claims priority from European patent applications EP 02257822.3, filed Nov. 12, 2002, and EP 03253636.9, filed Jun. 9, 2003, each of the foregoing application is incorporated herein in their entirety by reference.

FIELD

The present invention relates to immersion lithography.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications. WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse the substrate in a lithographic projection apparatus in a liquid having a relatively high refractive index, e.g. water, so as to fill a space between the final optical element of the projection lens and the substrate. The point of this is to enable imaging of smaller features because the exposure radiation will have a shorter wavelength in the liquid than in air or in a vacuum. (The effect of the liquid may also be regarded as increasing the effective NA of the system).

However, submersing the substrate or substrate and substrate table in a bath of liquid (see, for example, U.S. Pat. No. 4,509,852, hereby incorporated in its entirety by reference) may mean that there is a large body of liquid that must be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between the final element of the projection lens and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 22 and 23, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 23 shows the arrangement schematically in which liquid is supplied via inlet IN and is taken up on the other side of the element by outlet OUT which is connected to a low pressure source. In the illustration of FIG. 22 the liquid is supplied along the direction of movement of the substrate relative to the final element, though this does not need to be the case. Various orientations and numbers of in- and out-lets positioned around the final element are possible, one example is illustrated in FIG. 23 in which four sets of an inlet with an outlet on either side are provided in a regular pattern around the final element.

SUMMARY

Difficulties in large loss of liquid from the liquid supply system can arise with the system described above and any other systems that provide liquid on only a localized area of the substrate and between the projection system and the substrate when the localized area crosses over an edge of the substrate or other object.

Accordingly, it may be advantageous to provide, for example, a lithographic projection apparatus in which liquid loss from the supply system is minimized during passage over an edge portion of the substrate or other object.

According to an aspect, there is provided a lithographic projection apparatus comprising:
 a support structure configured to hold a patterning device, the patterning device configured to pattern a beam of radiation according to a desired pattern;
 a projection system configured to project the patterned beam onto a target portion of a substrate;
 a substrate table configured to hold the substrate, said substrate table comprising an edge seal member configured to at least partly surround an edge of at least one of said substrate and an object positioned on said substrate table and to provide a primary surface facing said projection system substantially co-planar with a primary surface of the said at least one of said substrate and said object; and
 a liquid supply system configured to provide a liquid, through which said beam is to be projected, in a space between said projection system and said at least one of said substrate and said object, wherein said liquid supply system provides liquid to a localized area of at least one of said object, said edge seal member and said substrate.

Where applied to a substrate, the edge seal member surrounds a position on the substrate table where, in use, the substrate is to be placed, e.g., surrounding the chuck or pimple table on which the substrate is held. In this way the substrate can be positioned closely adjacent to the edge of the edge seal member such that as an edge of the substrate moves under the projection system there is no sudden loss of liquid from the space because there is no large gap for the liquid to flow through. The edge seal member may be an integral part of the substrate table or may be moveably mounted relative to the remainder of the substrate table. In the latter case, it can be arranged such that the gap between the edge seal member and the substrate can be varied and/or the height of the primary surface of the edge seal member can be varied to accommodate variations in substrate height or thickness, i.e., to ensure that the primary surface of the edge seal member is substantially coplanar with the primary surface of the substrate. The above may also be applied to an object on the substrate table such as a sensor, e.g., a projection beam sensor.

In an embodiment, the substrate table comprises a gap seal member configured to abut or at least partly overlap, in the direction of the optical axis, both the edge seal member and said at least one of said substrate and said object. For example, in this way the gap between the edge seal member and a substrate (or an object), which is due to the size mismatch between the inner edge of the edge seal member and the outer edge of the substrate or object (which is necessary to accommodate slight variations in the diameter of the substrate or object), can be covered by the gap seal member. This further reduces the amount of liquid loss into the gap between the edge seal member and the substrate or object. In an embodiment, the gap seal member is configured to be in contact with the primary surfaces, thereby spanning the gap between the edge seal member and said at least one of said substrate and said object.

If the gap seal member has inner and outer edges, at least one of the edges may be tapered such that the thickness of the gap seal member facing away from the edge seal member or said at least one of said substrate and said object decreases towards the edge of the gap seal member. This helps the liquid supply system move smoothly over the gap between the substrate or object and the edge seal member.

A way to hold the gap seal member removably in place is to provide the substrate table with a vacuum port in the primary surface of said edge seal member.

Another way to minimise the amount of liquid which escapes into the gap between the edge seal member and the substrate or object is to provide the substrate table with a hydrophobic layer facing edge portions of said edge seal member and the substrate or object on an opposite side of the edge seal member and the substrate or object to the projection system. Such a hydrophobic layer may be any material which exhibits hydrophobic properties, for example Teflon, silicon rubber or other plastics materials. Inorganic coatings are generally desired because they have better radiation resistance than organic coatings. In an embodiment, the liquid has a contact angle of greater than 90° with the hydrophobic layer. This reduces the chances of liquid seeping into the gap.

According to an aspect, there is provided a lithographic projection apparatus comprising:
 a support structure configured to hold a patterning device, the patterning device configured to pattern a beam of radiation according to a desired pattern;
 a projection system configured to project the patterned beam onto a target portion of a substrate;
 a substrate table configured to hold the substrate, said substrate table comprising:
 an edge seal member configured to at least partly surround an edge of at least one of said substrate and an object positioned on said substrate table, and
 a further edge seal member configured to extend across the gap between said edge seal member and said at least one of said substrate and said object and to be in contact with said at least one of said substrate and said object; and
 a liquid supply system configured to provide a liquid, through which said beam is to be projected, in a space between said projection system and said at least one of said substrate and said object.

In this way the gap between the edge seal member and the substrate or object is closed off so that there is no gap between the edge seal member and the substrate or object through which liquid from the liquid supply system can pass. This is particularly so if the further edge seal member is flexible in which case a better seal between the further edge seal member and the substrate or object is achievable.

In an embodiment, the flexible further edge seal member is attached to the edge seal member and has a port, connected to a vacuum source, adjacent its end distal from said edge seal member, such that on actuation of said vacuum source, said flexible further edge seal member is deflectable upwards to contact against the substrate or object to form a seal between said flexible further edge seal member and the substrate or object due to the force generated by the vacuum source acting on the substrate or object. This allows the flexible further edge seal member to be actuatable to contact with the substrate or object and to be deactuatable so that it falls away from the substrate or object. The application of the vacuum ensures a good seal between the flexible further edge seal member and the substrate or object.

In another embodiment, the flexible further edge seal member is disposed between the edge seal member and the substrate or object and with a surface substantially co-planar with the primary surfaces of the edge seal member and the substrate or object. In this way the gap between the edge seal member and the substrate or object can be sealed such that only small amounts of liquid can pass into the gap. In an embodiment, the flexible further edge seal member is shaped to contact the substrate or object on the surface opposite its primary surface and may be effective to apply a force to the substrate or the object away from the substrate table when the substrate or object is held on the substrate table. In the case of the substrate, the flexible further edge seal member in this way may help in the removal of the substrate from the substrate table after exposure of the substrate.

According to an aspect, there is provided a lithographic projection apparatus comprising:
 a support structure configured to hold a patterning device, the patterning device configured to pattern a beam of radiation according to a desired pattern;
 a projection system configured to project the patterned beam onto a target portion of a substrate;
 a substrate table configured to hold the substrate, said substrate table comprising:
 an edge seal member configured to at least partly surround an edge of at least one of said substrate and an object positioned on said substrate table, and
 at least one of a vacuum port and a liquid supply port positioned to provide respectively a vacuum or liquid to the gap between said edge seal member and said at least one of said substrate and said object on a side opposite said projection system;
 a liquid supply system configured to provide a liquid, through which said beam is to be projected, in a space between said projection system and said at least one of said substrate and said object.

In the case of a liquid supply port, no liquid can find its way into the gap between the edge seal member and the substrate or object from the space between the projection system and the substrate or object, because that gap is already filled with liquid. If the vacuum alternative is used, any liquid which does find its way into that gap will be removed and may be recycled. The provision of vacuum is advantageous when a gas seal member of a liquid supply system is used to keep the liquid in the space between the projection system and the substrate or object. This is because it can not only remove any liquid passing into the gap but also any gas from the gas seal member.

Further, there may be provided a channel positioned radially inwardly of the vacuum port, the channel being connected to a gas source such that on actuation of the vacuum a flow of gas radially outwardly from said channel toward said vacuum can be established. Such a flow of gas can be used to ensure that any liquid which does reach the non-immersed side of the substrate or object is caught in the gas flow and transported away towards the vacuum.

According to an aspect, there is provided a lithographic projection apparatus comprising:
 a support structure configured to hold a patterning device, the patterning device configured to pattern a beam of radiation according to a desired pattern;
 a projection system configured to project the patterned beam onto a target portion of a substrate;
 a substrate table configured to hold the substrate, said substrate table comprising a support surface configured to support an intermediary plate between said projection system and at least one of said substrate and an object positioned on said substrate table and not in contact with said at least one of said substrate and said object; and a liquid supply system configured to provide a liquid, through which said beam is to be projected, in a space between said projection system and said at least one of said substrate and said object.

In this way an intermediary plate can be used which is of an overall size larger than the substrate or object so that, for example, during imaging of edge portions of the substrate or object, the liquid supply system is situated at a medial portion of the intermediary plate such that no or few problems with loss of liquid through gaps at edges exist. With such a system it is also possible to provide the substrate table with a transmission image sensor (TIS) configured to sense a beam and wherein the intermediary plate is positionable between the sensor and said projection system. Thus it is possible for the transmission image sensor to detect a beam under the same conditions that a substrate is to be imaged. It will therefore be possible to more accurately position the substrate table so that the projection beam is correctly focused on the substrate.

According to an aspect, there is provided a lithographic apparatus comprising:

a support structure configured to hold a patterning device, the patterning device configured to pattern a beam of radiation according to a desired pattern;

a projection system configured to project the patterned beam onto a target portion of a substrate;

a substrate table configured to hold the substrate; and a liquid supply system configured to provide a liquid, through which said beam is to be projected, in a space between said projection system and at least one of said substrate and an object positioned on said substrate table, wherein a structure of the liquid supply system extends along at least part of the boundary of said space between said projection system and said substrate table and capillaries extend away from said substrate table and are positioned between said structure and said projection system.

In this way, a larger gap may be spanned over the edge of the substrate or object before catastrophic liquid loss occurs as capillary action aids in the liquid spanning gaps.

In an embodiment, the inner coating of the capillary is hydrophobic and the apparatus comprises an electric device configured to apply a potential difference between said liquid in said space and said capillaries. In this way, an even larger gap may be spanned for liquid loss.

According to an aspect, there is provided a device manufacturing method comprising:

providing a liquid in a space between a projection system and at least one of a substrate and an object positioned on a substrate table;

projecting a patterned beam of radiation, through said liquid, onto a target portion of the substrate using the projection system; and either: providing an edge seal member surrounding at least part of an edge of said at least one of said substrate and said object and with a primary surface substantially co-planar to a primary surface of said at least one of said substrate and said object, wherein said liquid is provided to a localized area of at least one of said substrate, said object, and said edge seal member, or providing an edge seal member at least partly surrounding an edge of said at least one of said substrate and said object and a further edge seal member extending across the gap between the edge seal member and said at least one of said substrate and said object and in contact with said at least one of said substrate and said object, or providing an edge seal member at least partly surrounding an edge of said least one of said substrate and said object and providing at least one of a vacuum or liquid to the gap between the edge seal member and said least one of said substrate and said object on a side of said least one of said substrate and said object opposite to said projection system, or positioning an intermediary plate in the space between said least one of said substrate and said object and said projection system and not in contact with said least one of said substrate and said object, or providing a structure extending along at least part of the boundary of the space between said projection system and said substrate table and providing capillaries extending away from the substrate table between the structure and said projection system.

Although specific reference may be made in this text to the use of the apparatus described herein in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiment 1

Figure 1:
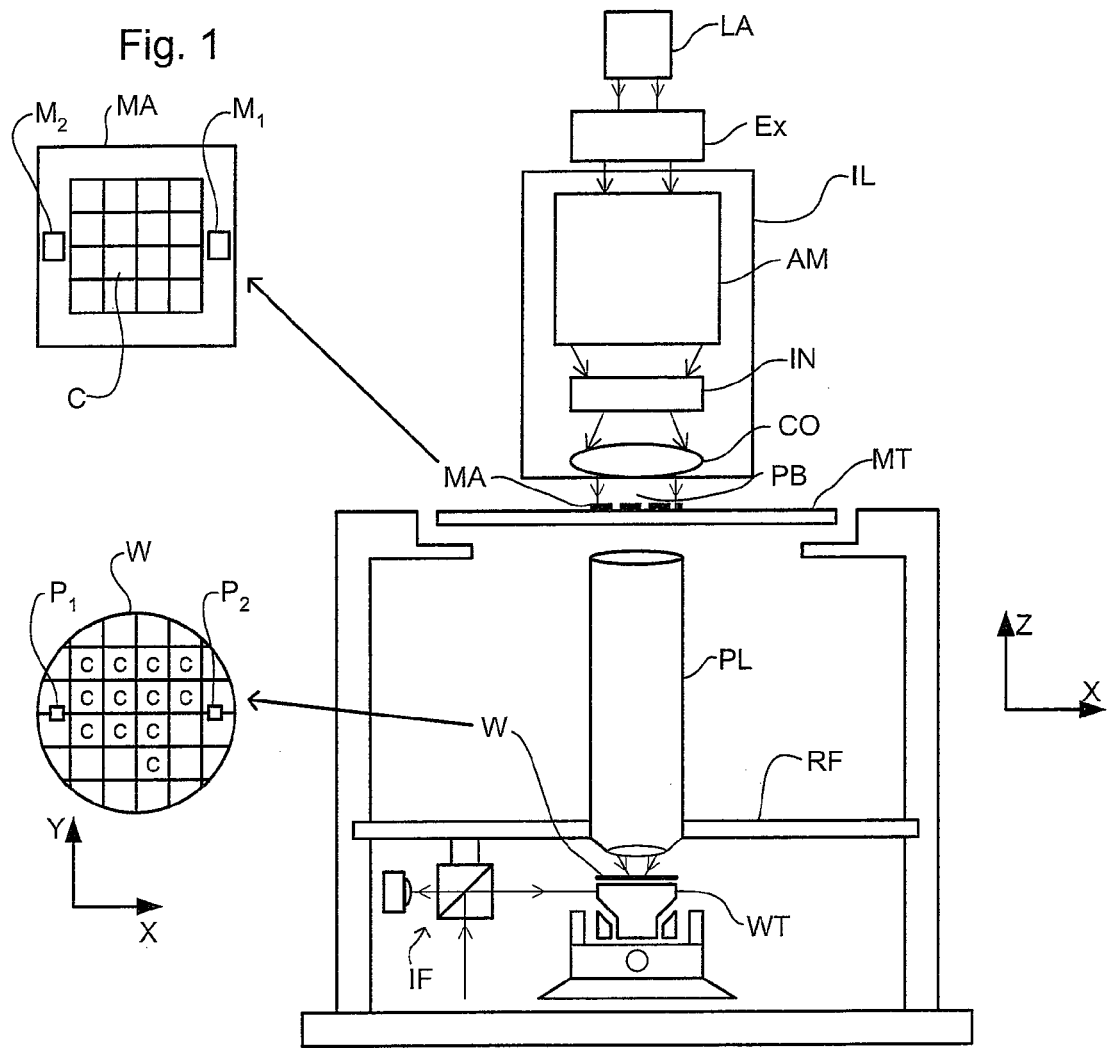
FIG. 1 depicts a lithographic projection apparatus according to an embodiment of the invention.

FIG. 1 schematically depicts a lithographic projection apparatus according to a particular embodiment of the invention. The apparatus comprises:

- a radiation system Ex, IL, for supplying a projection beam PB of radiation (e.g. DUV radiation), which in this particular case also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is, an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed $V=Mv$, in which M is the magnification of the lens PL (typically, $M=\frac{1}{4}$ or $\frac{1}{5}$). In this manner, a relatively large target portion C can be exposed, without having to compromise on resolution.

Figure 2:
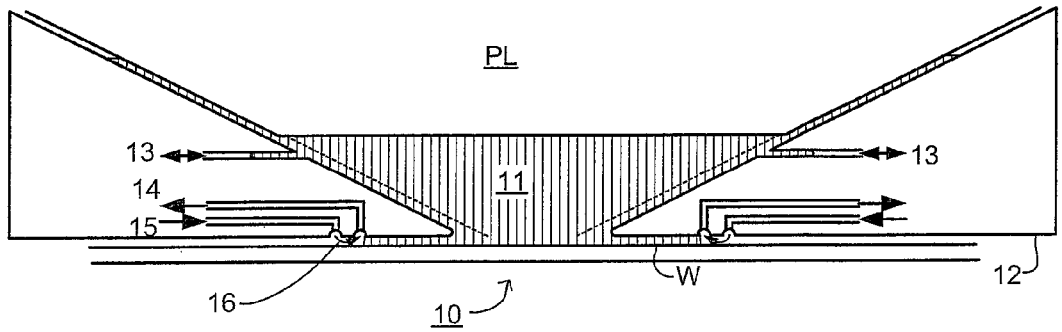
FIG. 2 depicts the liquid reservoir of a first embodiment of the invention.

FIG. 2 shows a liquid reservoir 10 between the projection system PL and the substrate W which is positioned on the substrate stage WT. The liquid reservoir 10 is filled with a liquid 11 having a relatively high refractive index, e.g. water, provided via inlet/outlet ducts 13. The liquid has the effect that the radiation of the projection beam is a shorter wavelength in the liquid than in air or in a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

The reservoir 10 forms, in an embodiment, a contactless seal to the substrate W around the image field of the projection system PL so that the liquid is confined to fill the space between the substrate's primary surface, which faces the projection system PL, and the final optical element of the projection system PL, The reservoir is formed by a seal member 12 positioned below and surrounding the final element of the projection system PL. Thus, the liquid supply system provides liquid on only a localized area of the substrate. The seal member 12 forms part of the liquid supply system for filling the space between the final element of the projection system PL and the substrate with a liquid. This liquid is brought into the space below the projection system PL and within the seal member 12. The seal member 12 in an embodiment extends a little above the bottom element of the projection system PL and the liquid rises above the final element so that a buffer of liquid is provided. The seal member 12 has an inner periphery that at the upper end closely conforms to the shape of the projection system PL or the final element thereof and may, e.g. be round. At the bottom the inner periphery closely conforms to the shape of the image field, e.g. rectangular, though this is not necessarily so. The seal member is substantially stationary in the XY plane relative to the projection system PL though there may be some relative movement in the Z direction (in the direction of the optical axis). A seal is formed between the seal member and the surface of the substrate. This seal is desired to be a contactless seal and may be a gas seal.

The liquid 11 is confined in the reservoir 10 by a seal device 16. As illustrated in FIG. 2, the seal device is a contactless seal i.e. a gas seal. The gas seal is formed by gas, e.g. air or synthetic air, provided under pressure via inlet 15 to the gap between seal member 12 and substrate W and extracted by first outlet 14. The over pressure on the gas inlet 15, vacuum level or under pressure on the first outlet 14 and the geometry of the gap are arranged so that there is a high-velocity gas flow inwards towards the optical axis of the apparatus that confines the liquid 11. As with any seal, some liquid is likely to escape, for example up the first outlet 14.

Figure 22:
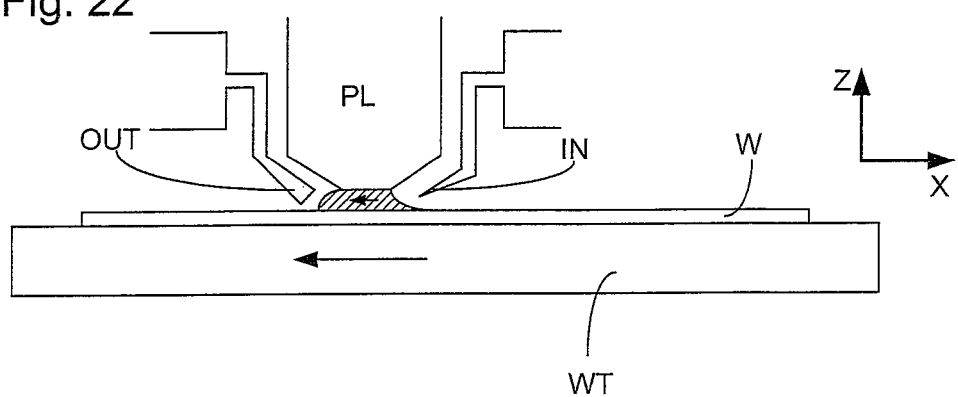
FIG. 22 illustrates an alternative liquid supply system according to an embodiment of the invention.
Figure 23:
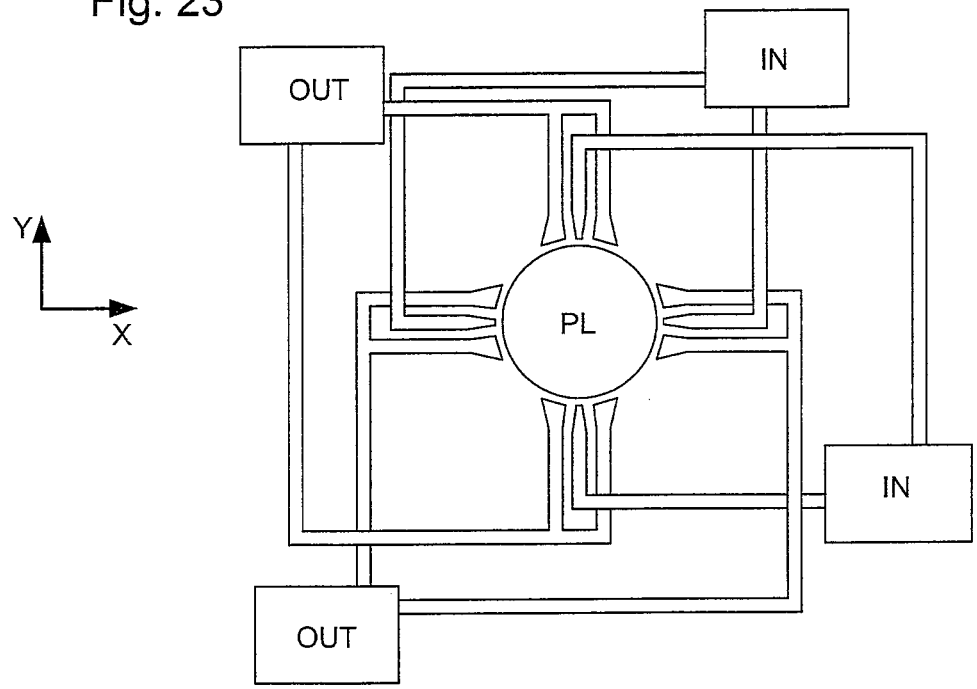
FIG. 23 illustrates, in plan, the system of FIG. 22.

FIGS. 22 and 23 also depict a liquid reservoir defined by inlet(s) IN, outlet(s) OUT, the substrate W and the final element of projection system PL. Like the liquid supply system of FIG. 2 the liquid supply system illustrated in FIGS. 22 and 23, comprising inlet(s) IN and outlet(s) OUT, supplies liquid to the primary surface of the substrate in a localized area between the final element of the projection system and the substrate and can suffer from loss of liquid at the substrate edge.

Thus, as used herein for the embodiments, the liquid supply system can comprise that as described in relation to FIG. 2 and FIGS. 22 and 23.

A problem with the liquid supply arrangement illustrated in FIGS. 2, 22 and 23 occurs when imaging edge portions of the substrate W. This is because when the substrate W edge is positioned underneath the projection system PL one of the constraining walls (the substrate W) of the liquid supply system (the bottom one as illustrated) is removed thereby allowing immersion liquid to escape. However, the embodiments described herein can be used with any other type of liquid supply system.

Figure 3:
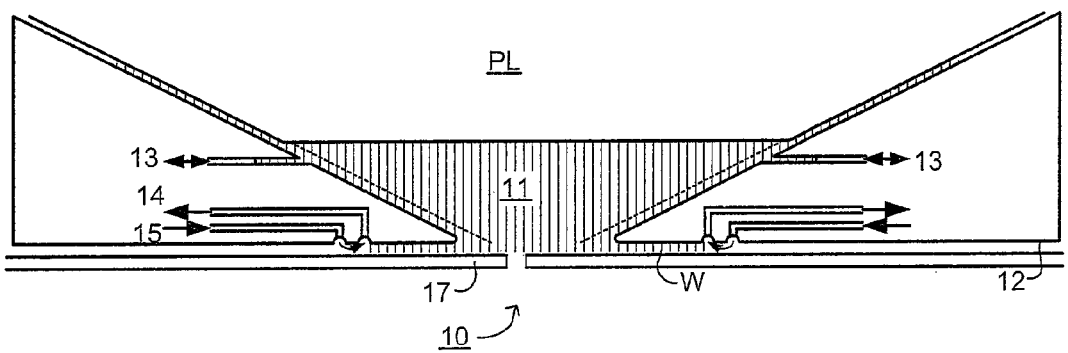
FIG. 3 is similar to FIG. 2 showing an edge seal member on the substrate table according to an embodiment of the invention.

FIG. 3 illustrates how the edge portion of a substrate W may be imaged without catastrophic loss of immersion liquid from the liquid supply system. This is achieved by the provision of a cover plate or edge seal member 17 on the substrate table WT. The edge seal member 17 has an upper (as illustrated) primary surface substantially co-planar with the upper primary surface of substrate W and is closely adjacent to the edge of the substrate W so that there is no sudden loss of liquid as the edge of the substrate moves under the projection system PL. Some liquid loss into the gap may still occur. Of course there are arrangements in which the whole construction illustrated in FIGS. 2 and 3 is positioned upside down so that it is the lower surfaces of the edge seal member and the substrate which face the projection system and which are substantially co-planar. The surfaces are therefore referred to as the primary surfaces which face the projection system PL rather than upper surfaces. References herein to upper surfaces and lower surfaces may be also appropriately considered as references to lower and upper surfaces respectively in an upside-down configuration.

With this system, the liquid supply system (e.g. reservoir 10) can be positioned over the edge of the substrate W and can even be moved completely off the substrate W. This enables edge portions of the substrate W to be imaged.

Figure 4:
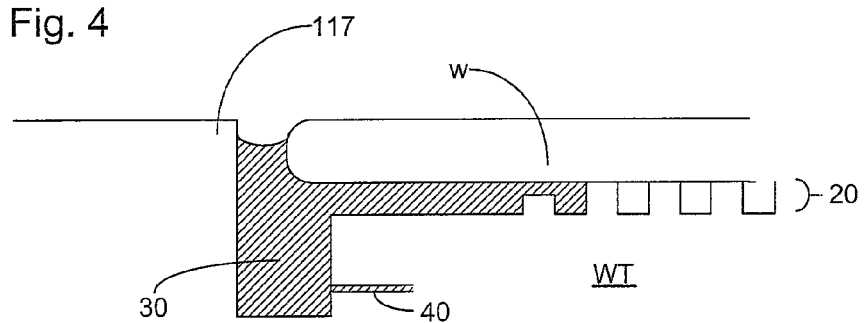
FIG. 4 illustrates a second embodiment of the invention.
Figure 5:
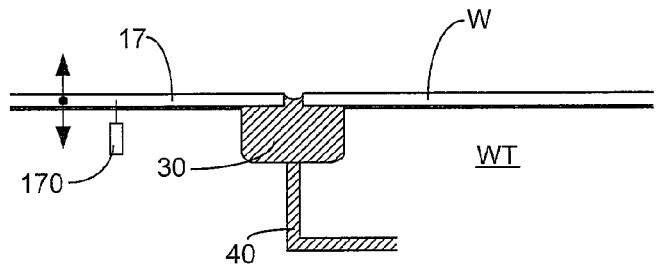
FIG. 5 illustrates an alternative form of the second embodiment of the present invention.
Figure 6:
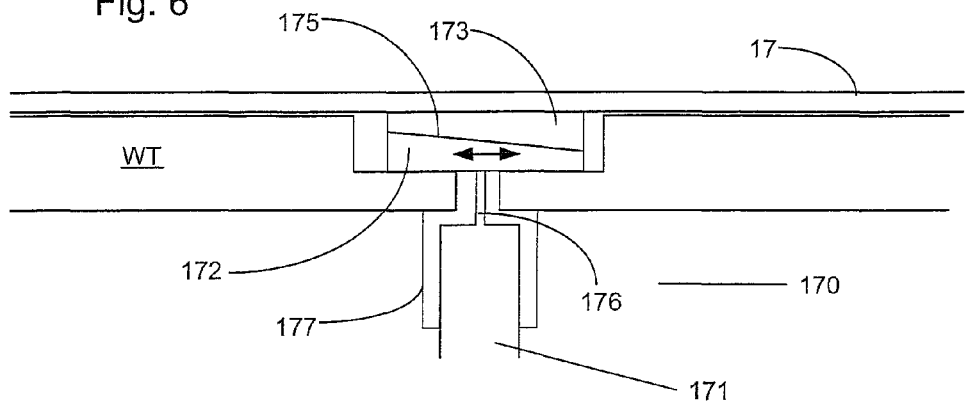
FIG. 6 illustrates a detail of the second embodiment of the present invention.

The edge seal member 17 may form an integral part of the substrate table WT (as illustrated in FIG. 4 as edge seal member 117) or may be temporarily mounted relative to the remainder of the substrate table by the use of, for example, vacuum suction or through use of electromagnetic forces. In an embodiment, the edge seal member 17 is moveable relative to the remainder of the substrate table (as illustrated in FIGS. 5 and 6) such that the height above the substrate table WT of the primary surface of the edge seal member 17 may be adjusted such that it is substantially co-planar with the primary surface of the substrate W. In this way the same edge seal member 17 may be used for different thicknesses of substrate W (thickness tolerance is about 25 μm though the embodiment can account for up to about 0.2 mm variation). The positioning mechanism for the edge seal member 17 may be through use of piezoelectric elements or electromagetism, worm gear, etc. A suitable mechanism is described in relation to the second embodiment described below.

The edge seal member 17 may be formed of several individual segments, each of which surrounds a portion of the edge of the substrate W.

Embodiment 2

A second embodiment is illustrated in FIGS. 4 to 6 and is the same or similar as the first embodiment except as described below.

In the embodiment of FIGS. 4 and 5 an edge liquid supply system provides liquid to a reservoir 30 via a port 40. The liquid in the reservoir 30 is optionally the same as the immersion liquid in the liquid supply system. The reservoir 30 is positioned on the opposite side of the substrate W to the projection system PL and adjacent the edge of the substrate W and the edge of the edge seal member 17, 117. In FIG. 5, the edge seal member 17 is comprised of an element which is separate to the substrate table WT whereas in FIG. 4 the edge seal member 117 is provided by an integral portion of the substrate table WT. As can be seen most clearly from FIG. 4, the substrate W is supported on the substrate table WT by a so-called pimple table 20. The pimple table 20 comprises a plurality of projections on which the substrate W rests. The substrate W is held in place by, e.g., a vacuum source sucking the substrate onto the top surface of the substrate table WT. With the use of the reservoir 30, when the edge of the substrate W is being imaged, (i.e. when liquid in the liquid supply system between the projection system PL and the substrate W traverses across an edge of the substrate), liquid cannot escape from the liquid supply system into the gap between the edge seal member 17, 117 and the substrate W because that space is already filled with liquid.

The mechanism 170 shown in FIG. 5 for moving the edge seal member 17 relative to the remainder of the substrate table WT is illustrated in detail in FIG. 6. The reason for moving the edge seal member 17 in this way is so that its primary surface can be made to be substantially co-planar with the primary surface of the substrate W. This allows a smooth movement of the liquid supply system over edge portions of the substrate W so that the bottom inner periphery of the liquid supply system can be moved to positions partly on the primary surface of substrate W and partly on the primary surface of the edge seal member 17.

A level sensor (not illustrated) is used to detect the relative heights of the primary surfaces of the substrate W and the edge seal member 17. Based on the results of the level sensor, control signals are sent to the actuator 171 in order to adjust the height of the primary surface of the edge seal member 17. A closed loop actuator could also be used for this purpose.

In an embodiment, the actuator 171 is a rotating motor which rotates a shaft 176. The shaft 176 is connected to a circular disc at the end distal to the motor 171. The shaft 176 is connected away from the centre of the disc. The disc is located in a circular recess in a wedge portion 172. Ball bearings may be used to reduce the amount of friction between the circular disc and the sides of the recess in the wedge portion 172. The motor 171 is held in place by leaf springs 177. On actuation of the motor the wedge portion is driven to the left and right as illustrated (i.e. in the direction of the slope of the wedge portion) because of the excentre position of the shaft 176 in the disc. The motor is prevented from moving in the same direction as the direction of movement of the wedge portion 172 by the springs 177.

As the wedge portion 172 moves left and right as illustrated in FIG. 6, its top surface 175 (which is the surface of the wedge which is sloped in relation to the primary surface of the edge seal member 17) contacts the bottom sloped surface of a further wedge member 173 which is fixed to the bottom of the edge seal member 17. The edge seal member 17 is prevented from moving in the direction of movement of the wedge member 172 so that when the wedge member 172 moves left and right the edge seal member 17 is lowered and raised respectively. Some biasing of the edge seal member 17 towards the substrate table WT may be necessary.

Obviously the further wedge member 173 could be replaced by an alternative shape, for example a rod positioned perpendicularly to the direction of movement of the wedge 172. If the coefficient of friction between the wedge member 172 and the further wedge member 173 is greater than the tangent of the wedge angle then the actuator 170 is self-braking meaning that no force is required on the wedge member 172 to hold it in place. This is advantageous as the system will then be stable when the actuator 171 is not actuated. The accuracy of the mechanism 170 is of the order of a few µm.

Especially in the case of the edge seal member 117 being an integral part of the substrate table WT, a mechanism may be provided to adjust the height of the substrate W or the member supporting the substrate W so that the primary surfaces of the edge seal member 17, 117 and the substrate can be made substantially co-planar.

Embodiment 3

A third embodiment is illustrated in FIG. 7 and is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT. In this embodiment it is not vital however that the edge seal member 17 has an upper surface co-planar with the primary surface of the substrate, but this is desired. A vacuum port 46 connected to a vacuum source is provided underneath and adjacent edge portions of the edge seal member 117 and the substrate W on the opposite side of the substrate W to the projection system PL. In an embodiment, the port 46 is annular and formed by a continuous groove but may be discontinuous i.e. a discrete number of openings arranged in a circular pattern. In its simplest form the embodiment may work only with that vacuum supply via port 46. However, the basic idea can be improved by the provision of a substrate table WT as illustrated in detail in FIG. 7a which illustrates a first version of the third embodiment.

A portion 48 of the substrate table WT extends from the edge of the edge seal portion 117 radially inwardly so that it is positioned below the substrate table W on the other side of the substrate W to the projection system PL. Any immersion liquid which leaks through the gap between the portion 48 and the substrate W is attracted towards the vacuum source via port 46. A channel 42 is provided radially inwardly of the vacuum source also under the substrate W and is connected to a gas source. This may be a gas at a pressure greater than atmospheric pressure or it may be that the channel 42 is simply open to the atmosphere. This creates a flow of gas radially outwardly below the substrate W between the portion 48 of substrate table WT below the substrate W and the pimple table 20. (The pimple table 20 has its own vacuum source to hold the substrate in place.) With this flow of gas any liquid escaping between edge seal member 117 and the substrate W is pulled towards an annular compartment 44 (roughly 3×3 mm in cross section) in fluid connection with the vacuum source. The compartment 44 is positioned between an annular port 47 open to the gap and the port 46 connected to the vacuum source. The compartment helps in establishing uniform flow around the periphery. The channel 42 is connected to a continuous annular groove (shown as a widening of the duct). The compartment 44, port 47, and/or the groove of channel 42 need not be annular and can be other appropriate shapes or configurations.

In one working embodiment, the gap between the portion 48 of substrate table WT and the substrate W is of the order of up to 100 µm (though the gap may not exist i.e. is zero), which prevents a high flow rate of liquid through the gap due to capillary action. The height of the portion 45 of the substrate table WT between the groove connected to channel 42 and compartment 44 is such that the distance between the bottom of the substrate W and the top of that portion 45 (indicated as distance D1 in FIG. 7a) is typically of the order of 100 µm and is chosen such that a uniform gas flow of in the region of at least 1 m/s is achievable with a pressure loss of less than 0.5 bar. Such an arrangement ensures that only very little, if any, liquid passes through the gap D1 and interferes with the pimple table 20. Other values will also work.

Figure 7A:
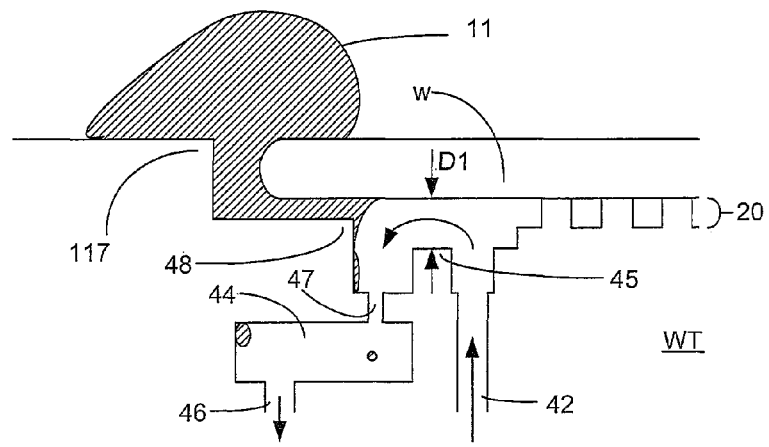
FIGS. 7a-d illustrate four versions of a third embodiment of the present invention.

A first version of the third embodiment illustrated in FIG. 7a may suffer from deflection of the outer 10 mm or so of the substrate W. As can be seen from FIG. 7a this area is unsupported even though, as said above, portion 45 can be extended to underneath the substrate W where it supports the substrate W. However, at the very outer radius both the weight of the substrate W and the capillary force of liquid between the substrate W and portion 48 of the substrate table WT can still deflect the edge of the substrate W. This may be deleterious. Solutions to this problem are illustrated in FIGS. 7b-d which illustrate second through fourth versions of the third embodiment.

Figure 7B:
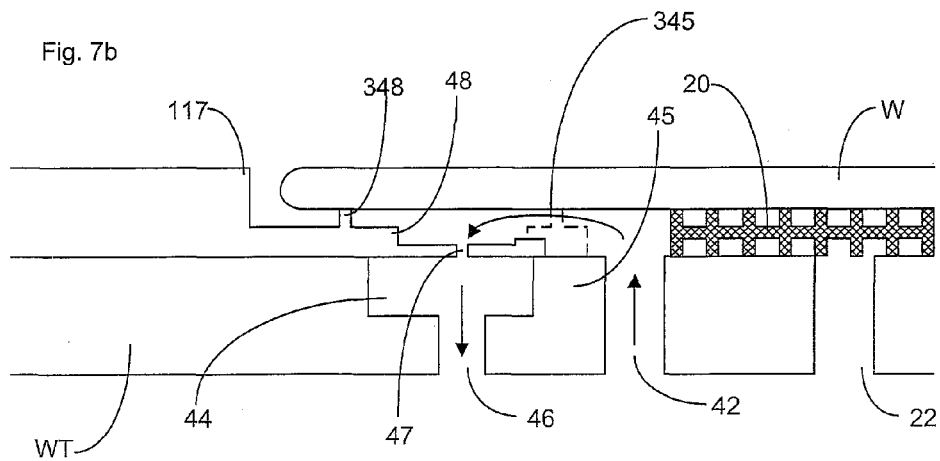
Figure 7C:
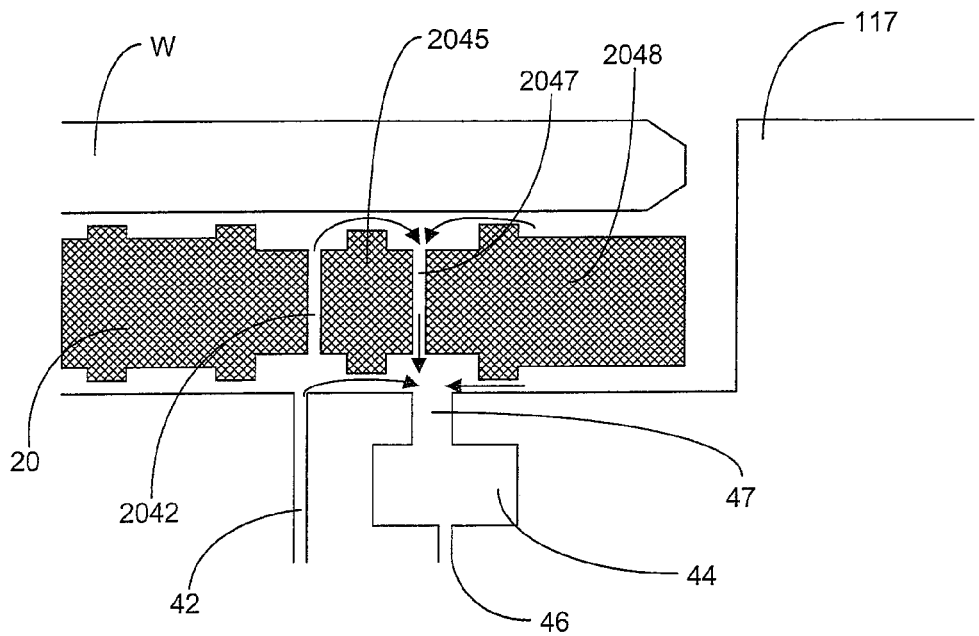
Figure 7D:
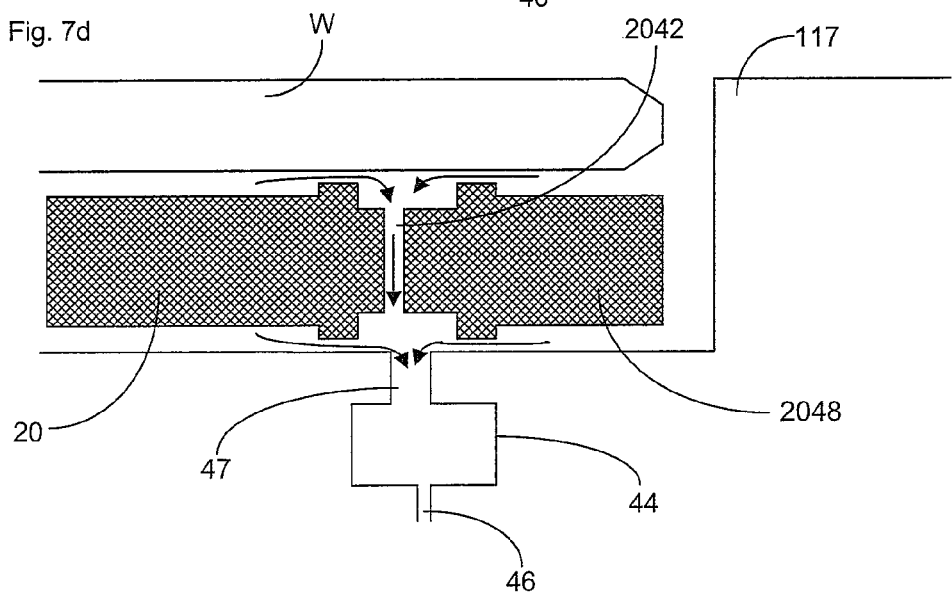

In the second version illustrated in FIG. 7b, the portion 48 has at least one set of burls 348 positioned around and near to the edge of the periphery of the substrate W (typically in a circular pattern). As the burls 348 are discrete, immersion liquid can still seep between the portion 48 and the substrate W but the weight of the substrate W is supported by the at least one set of burls 348. In an embodiment, the burls 348 have a smaller height than the burls of the pimple table 20 which compensates for the difference in the force downwards on the substrate W caused by the vacuum 22 of the pimple table 20 compared to the force on the substrate W at the edge in the vicinity of burls 348. The calculation must take the stiffness of the burls into account and if the burls are manufactured from a low expansion material such as Zerodur, they should be about 80 nm less high than the burls of the pimple table 20. The gap between the portion 48 and the bottom of the substrate W is in an embodiment about 20 µm.

In the version of FIG. 7b, portion 45 is similar in shape to that of the first version. However, an alternative has a ring or circular pattern of burls 345 positioned above portion 45. The discrete nature of the burls 345 allows gas from channel 42 to be sucked into the compartment 44. These burls 345 are also about 80 nm less high than the burls of the pimple table 20. In an embodiment, gap D1 in between the burls 345 is about 50 µm. The burls 345 may be formed by the pimple table 20 and need not necessarily be part of the substrate table WT.

From the above two versions of the third embodiment it will be clear that the architecture of the gas seal formed by passages 42 and 47 can be formed either completely by the substrate table WT, completely by the pimple table 20 or by a combination of both. FIGS. 7c and 7d illustrate two further versions of the third embodiment. FIG. 7c illustrates a third version of the third embodiment in which the gas seal is formed by members of the pimple table 20. The portion 45 of the first and second versions is formed by a (annular) portion of the pimple table 2045 and portion 48 of the first and second versions is formed by (annular) portion 2048 of the pimple table 20. Passages 2042, 2047 equivalent to 42 and 47 are formed between the portions 20, 2045 and 2048. However, only a part of the gas flow passes through the two passages 2042, 2047; as illustrated, some gas flows under the pimple table 20 which is effective to block further ingression of immersion liquid which seeps under the outer edge of the pimple table 20. This arrangement has an advantage that all of the accurate dimensions are made in the pimple table 20 and the substrate table WT does not contain any complex grooves.

In a fourth version of the third embodiment illustrated in FIG. 7d, no inlet channel 42 is provided and gas flows from the pimple table 20 into (annular) port 47. This version has an advantage that a more stable pressure is experienced between the substrate W and the pimple table 20 because the pimple table 20 does not need its own vacuum source. Furthermore, extra passage 2047 which is provided in the third version is no longer necessary and only passage 2042 is used. Thus, a single vacuum source is effective both to clear away leaking immersion fluid as well as holding the substrate in place. A gas source may be required under the pimple table 20 (perhaps the more usual vacuum port in the substrate table under the pimple table can be used for this purpose) so that a flow of gas outwards can be established.

It will be clear that various features of each of the versions of the third embodiment can be combined so long as a flow of gas radially outwardly from the centre of the pimple table towards the vacuum 46 is achieved.

Embodiment 4

Figure 8A:
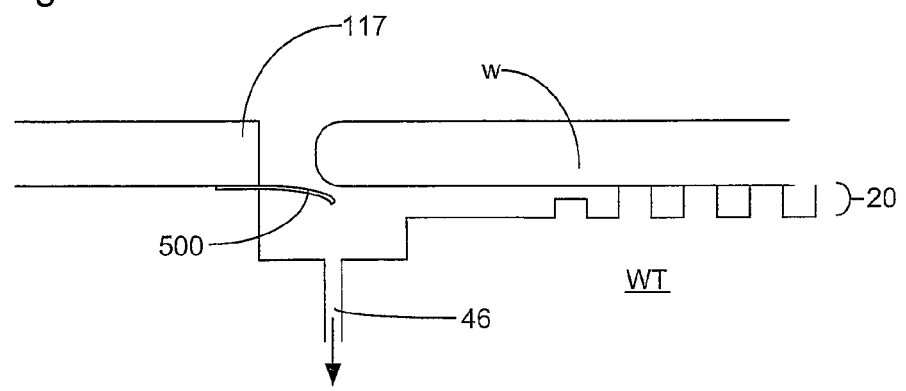
FIG. 8a illustrates a first version of a fourth embodiment of the present invention.
Figure 8B:
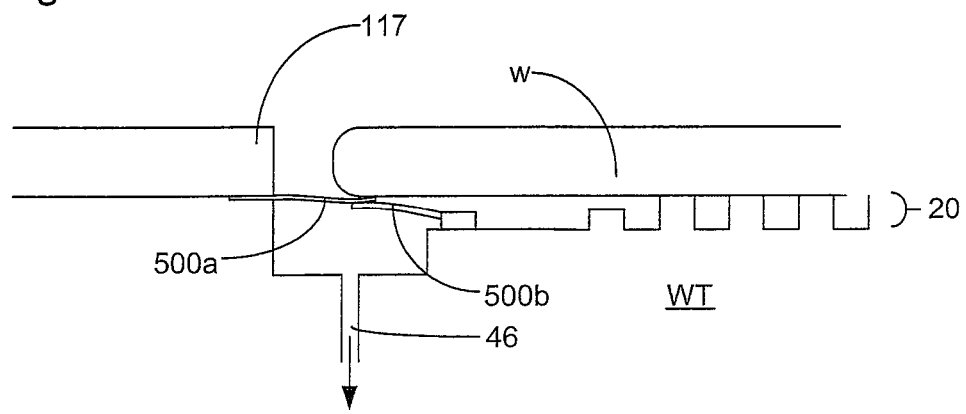
FIG. 8b illustrates a second version of the fourth embodiment.
Figure 8C:
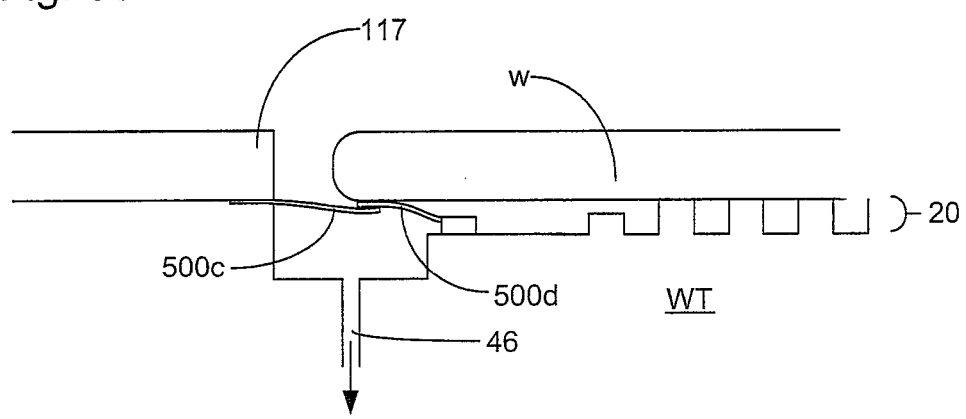
FIG. 8c illustrates a third version of the fourth embodiment.
Figure 9:
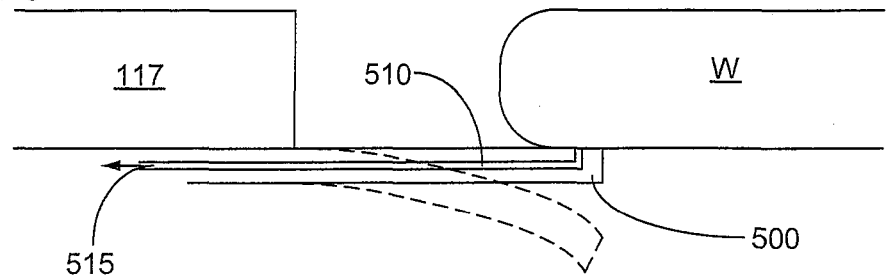
FIG. 9 illustrates in detail further aspects of the first version of the fourth embodiment of the present invention.

A fourth embodiment is illustrated in FIGS. 8 and 9 and is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

In a first version of this embodiment as illustrated in FIG. 8a, a further edge seal member 500 is used to bridge the gap between the edge seal member 117 and the substrate W. The further edge seal member is affixed to the edge seal member 117. The further edge seal member 500 is removably attachable against the surface of the substrate W opposite the primary surface. In this embodiment the further edge seal member 500 can be a flexible edge seal member which is actuatable to contact the under surface of the substrate W. When the flexible edge seal member 500 is deactivated it falls away from the substrate under gravity. The way this may be achieved is illustrated in FIG. 9 and is described below.

It is likely that the further edge seal member 500 will not prevent all of the immersion liquid from the liquid supply system from entering the space under the substrate W and for this reason a port 46 connected to a low pressure source may be provided under the substrate W adjacent edges of the edge seal member 117 and the substrate W in some or all of the versions of this embodiment. Of course the design of the area under the substrate could be the same as that of the third embodiment.

The same system can be used for sensors such as a transmission image sensor (TIS) on the substrate table as opposed for the substrate W. In the case of sensors, as the sensors do not move, the edge seal member 500 can be permanently attached to the sensor, for example using glue.

Furthermore, the edge seal member 500 can be arranged to engage with the top surface of the object (that surface closest to the projection system PL) rather than the bottom surface. Also, the further edge seal member 500 may be provided attached to or near the top surface of the edge seal member 117 as opposed to under the edge seal member 117 as is illustrated in FIG. 8a.

A second version of this embodiment is illustrated in FIG. 8b. Two further edge seal members 500a, 500b are used. The first of these edge seal members 500a is the same as in the first version. The second of these edge seal members 500b is affixed to the substrate table 20 i.e. underneath the substrate W and extends with its free end radially outwardly from its attachment point. The second further edge seal member 500b clamps the first further edge seal member 500a against the substrate W. Compressed gas can be used to deform or move the second further edge seal member 500b.

A third version of this embodiment is shown in FIG. 8c. The third version is the same as the second version except the first further edge seal member 500c clamps the second further edge seal member 500d to the substrate W. This avoids, for example, the need for the compressed gas of the second version.

It will be appreciated that the embodiment will also work with only the second further edge seal member 500b, 500d with or without connection to vacuum.

Various ways of deforming the further edge seal members 500, 500a, 500b, 500c, 500d will now be described in relation to the first version of the embodiment.

As can be seen from FIG. 9, a channel 510 is formed in the elongate direction of a flexible further edge seal member 500 (which in an embodiment is an annular ring) and (a) discrete port(s) are provided in an upper surface of the flexible further edge seal member which faces the projection system PL and the underside of the substrate W. By connecting a vacuum source 515 to the duct 510 the flexible further edge seal member can be made to abut the substrate W by suction. When the vacuum source 515 is disconnected or switched off, the flexible further edge seal member 500 drops under gravity and/or pressure from port 46 to assume the position shown in dotted lines in FIG. 9.

In an alternative embodiment a flexible further edge seal member 500 is formed with a mechanical pre-load such that it contacts the substrate W when the substrate is placed on the pimple table 20 and the flexible further edge seal member 500 deforms elastically so that it applies a force upwards on the substrate W to thereby make a seal.

In a further alternative, a flexible further edge seal member 500 may be forced against the substrate W by an overpressure generated by pressurised gas on port 46.

A flexible further edge seal member 500 may be fashioned from any flexible, radiation and immersion liquid resistant, non-contaminating material, for example, steel, glass e.g. $Al_2O_3$, ceramic material e.g. SiC, silicon, Teflon, low expansion glasses (e.g. Zerodur (TM) or ULE (TM)), carbon fibre epoxy or quartz and is typically between 10 and 500 µm thick, in an embodiment between 30 and 200 µm or 50 to 150 µm in the case of glass. With a flexible further edge seal member 500 of this material and these dimensions, the typical pressure to be applied to the duct 510 is approximately 0.1 to 0.6 bar.

Embodiment 5

Figure 10:
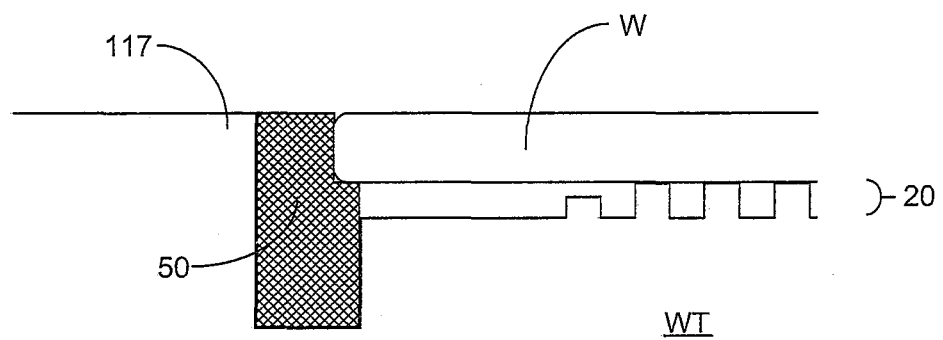
FIG. 10 illustrates a fifth embodiment of the present invention.

A fifth embodiment is illustrated in FIG. 10 and is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

In the fifth embodiment, the gap between the edge seal member 117 and the substrate W is filled with a further edge seal member 50. The further edge seal member is a flexible further edge seal member 50 which has a top surface which is substantially co-planar with the primary surfaces of the substrate W and the edge seal member 117. The flexible further edge seal member 50 is made of a compliant material so that minor variations in the diameter/width of substrate W and in the thickness of the substrate W can be accommodated by deflections of the flexible further edge seal member 50. When liquid in the liquid supply system under the projection system PL passes over the edge of the substrate, the liquid cannot escape between the substrate W, flexible further edge seal member 50 and edge seal member 117 because the edges of those elements are tight against one another. Furthermore, because the primary surfaces of the substrate W and the edge seal member 117 and the top surface of the flexible further edge seal member 50 are substantially co-planar, the liquid supply system operation is not upset when it passes over the edge of the substrate W so that disturbance forces are not generated in the liquid supply system.

As can be seen from FIG. 10, the flexible further edge seal member 50 is in contact with a surface of the substrate W opposite the primary surface of the substrate W, at an edge portion. This contact has two functions. First the fluid seal between the flexible further edge seal member 50 and the substrate W may be improved. Second, the flexible further edge seal member 50 applies a force on the substrate W in a direction away from the pimple table 20. When the substrate W is held on the substrate table WT by, e.g. vacuum suction, the substrate can be held securely on the substrate table. However, when the vacuum source is switched off or disconnected, the force produced by the flexible further edge seal member 50 on the substrate W is effective to push the substrate W off the substrate table WT thereby aiding loading and unloading of substrates W.

The flexible further edge seal member 50 is made of a radiation and immersion liquid resistant material such as PTFE.

Embodiment 6

Figure 11:
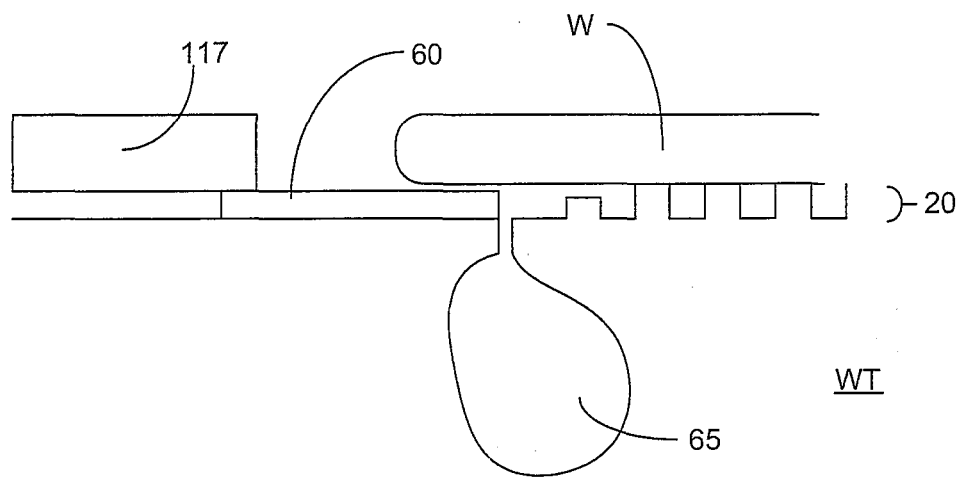
FIG. 11 illustrates a sixth embodiment of the present invention.

FIG. 11 illustrates a sixth embodiment which is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

The sixth embodiment illustrates how the pimple table 20 can be decoupled from the liquid supply system between the substrate W and the edge seal member 117. This is done by positioning an opening exposed to the atmosphere 65 between the edge of the substrate W and the vacuum holding the substrate W on the substrate table WT and associated with the pimple table 20.

A layer 60, positioned on the opposite side of the substrate W to the projection system PL and under the substrate at its edge leaving a gap between the substrate W and the layer 60 of about 10 µm, comprises any material which is hydrophobic such as Teflon (TM), silicon rubber, or other plastics material. Inorganic materials are desired because they have better radiation resistance. In this way, liquid which finds its way into the gap between the substrate W and the edge seal member 117 when the liquid supply system is positioned over the edge of the substrate W is repelled such that an effective seal is formed and liquid does not find its way to the pimple table 20. In an embodiment, the immersion liquid has a contact angle of at least 90° with the hydrophobic layer 60.

Embodiment 7

A seventh embodiment will be described with reference to FIGS. 12 to 15. The seventh embodiment is the same or similar as the first embodiment except as described below.

Figure 12:
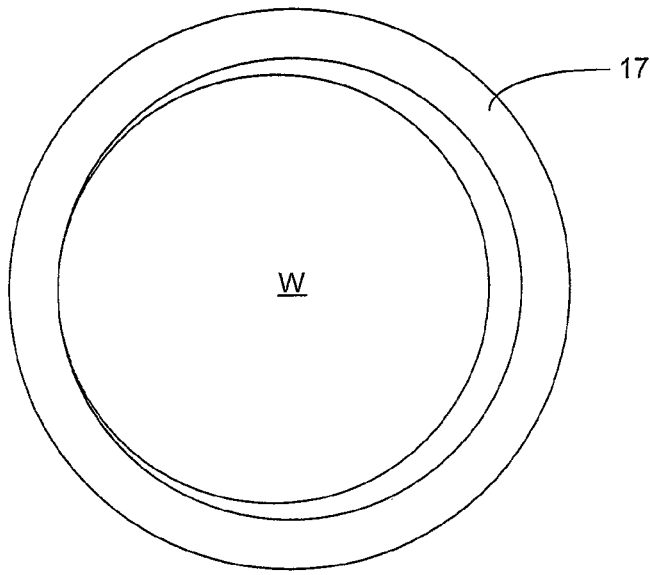
FIG. 12 illustrates in plan the substrate and edge seal member of a seventh embodiment of the present invention.

In the seventh embodiment, as is illustrated in FIG. 12, the edge seal member 17 is annular with a central hole larger than the diameter of the circular substrate W. The shapes of the substrate W and edge seal member 17 may be different than annular so long as the central hole of the edge seal member 17 is larger than the outer diameter/width of the substrate W. In this way, the edge seal member 17 may accommodate variations in the substrate W diameter/width.

Figure 13:
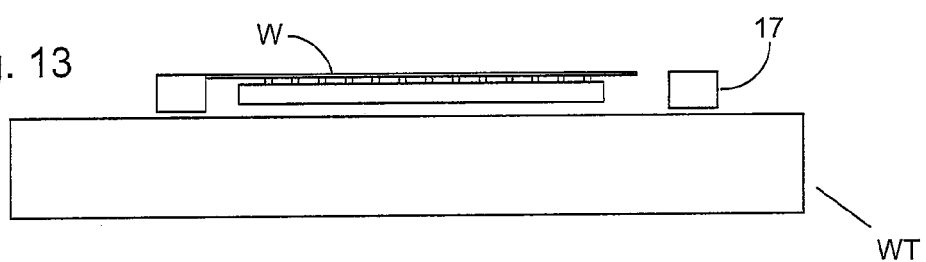
FIG. 13 illustrates a cross section through the seventh embodiment of the present invention.

The edge seal member 17 is movable on the substrate table WT such that when the liquid supply system moves towards an edge portion of the substrate W in order to expose it, the edge seal member 17 can be moved closely to abut that edge portion of the substrate W which is to be exposed. This is best illustrated in FIG. 13 where the left hand side of the substrate W is about to be exposed.

Figure 14:
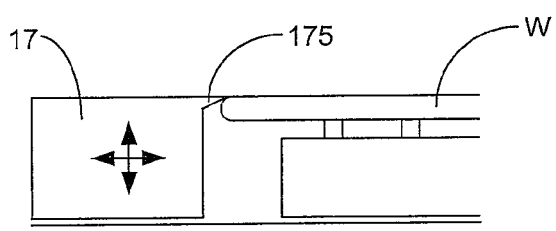
FIG. 14 illustrates a detail of the seventh embodiment of the present invention.

As is clearly illustrated in FIG. 14, the edge seal member 17 is movable both in the plane of the primary surface of the substrate W and in an embodiment also in the Z direction (i.e. in the direction of the optical axis of the apparatus). In this way, the edge seal member 17 can be moved to the edge of the substrate W when required and can have the height of its top (primary) surface adjusted so that its primary surface is closely co-planar with the primary surface of the substrate W. This allows the liquid supply system to effectively contain the immersion liquid in its reservoir even when the edge of the substrate W is being imaged.

Also illustrated in FIG. 14 is a projection 175 which has a top surface which is co-planar with the primary surface of the edge seal member 17, i.e. the primary surface of the edge seal member 17 overhangs on an edge adjacent the substrate W so that the projection extends towards the optical axis of the apparatus. As can be seen from FIG. 14, this allows the gap between the primary surfaces of the substrate W and edge seal member 17 to be minimised even when the edge of the substrate W is slightly curved (i.e. the edge of the substrate W is not perpendicular to the primary surface).

Figure 15:
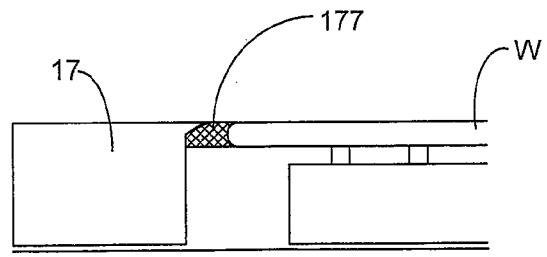
FIG. 15 illustrates in detail a further arrangement of the seventh embodiment.

Another way of improving or reducing the gap between the edge seal member 17 and the substrate W is to provide a further (flexible) edge seal member 177 between the edge of the edge seal member 17 closest to the substrate W and the substrate W. This is illustrated in FIG. 15. This may be done with or without a projection 175. A further flexible edge seal member 177 can deform around the edge of the substrate W so as to form a tight seal with the substrate W. The further flexible edge seal member 177 is attached to the edge seal member 17. The further flexible edge seal member 177 has an upper surface which is substantially co-planar with the primary surfaces of the substrate W and the edge seal member 17.

Embodiment 8

Figure 16:
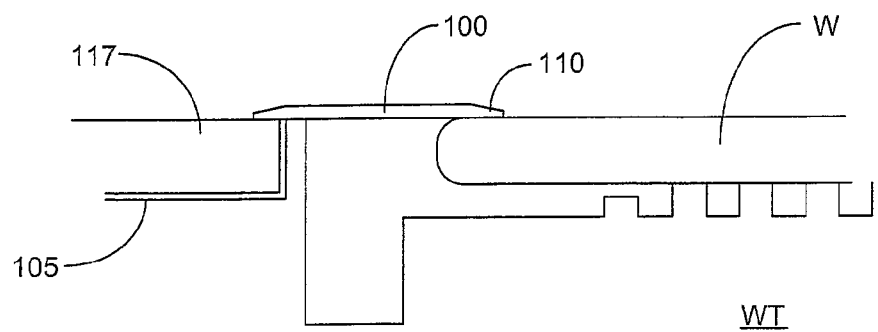
FIG. 16 illustrates an eighth embodiment of the present invention.

FIG. 16 illustrates an eighth embodiment which is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

As can be seen from FIG. 16, the eighth embodiment includes a further edge seal member 100 for bridging the gap between the edge seal member 117 and the substrate W. In this case the further edge seal member 100 is a gap seal member which is positioned on the primary surfaces of the substrate W and the edge seal member 117 to span the gap between the substrate W and edge seal member 117. Thus, if the substrate W is circular, the gap seal member 100 will also be circular (annular).

The gap seal member 100 may be held in place by the application of a vacuum 105 to its underside (that is a vacuum source exposed through a vacuum port on the primary surface of the edge seal member 117). The liquid supply system can pass over the edge of the substrate W without the loss of liquid because the gap between the substrate W and the edge seal member 117 is covered over by the gap seal member 100. The gap seal member 100 can be put in place and removed by the substrate handler so that standard substrates and substrate handling can be used. Alternatively, the gap seal member 100 can be kept at the projection system PL and put in place and removed by appropriate mechanisms (e.g. a substrate handling robot). The gap seal member 100 should be stiff enough to avoid deformation by the vacuum source. Advantageously the gap seal member 100 is less than 50, in an embodiment 30 or 20 or even 10 μm thick to avoid contact with the liquid supply system, but should be made as thin as possible.

The gap seal member 100 is advantageously provided with tapered edges 110 in which the thickness of the gap seal member 100 decreases towards the edges. This gradual transition to the full thickness of the gap seal member ensures that disturbance of the liquid supply system is reduced when it passes on top of the gap seal member 100.

The same way of sealing may be used for other objects such as sensors, for example transmission image sensors. In this case, as the object is not required to move, the gap seal member 100 can be glued in place (at either end) with a glue which does not dissolve in the immersion liquid. The glue can alternatively be positioned at the junction of the edge seal member 117, the object and the gap seal member 100.

Furthermore, the gap seal member 100 can be positioned underneath the object and an overhang of the edge seal member 117. The object may be shaped with an overhang also, if necessary.

The gap seal member 100, whether above or below the object, can have a passage provided through it, from one opening in a surface in contact with the edge seal member 117 to another opening in a surface in contact with the object. By positioning one opening in fluid communication with vacuum 105, the gap seal member 100 can then be kept tightly in place.

Embodiment 9

Figure 17:
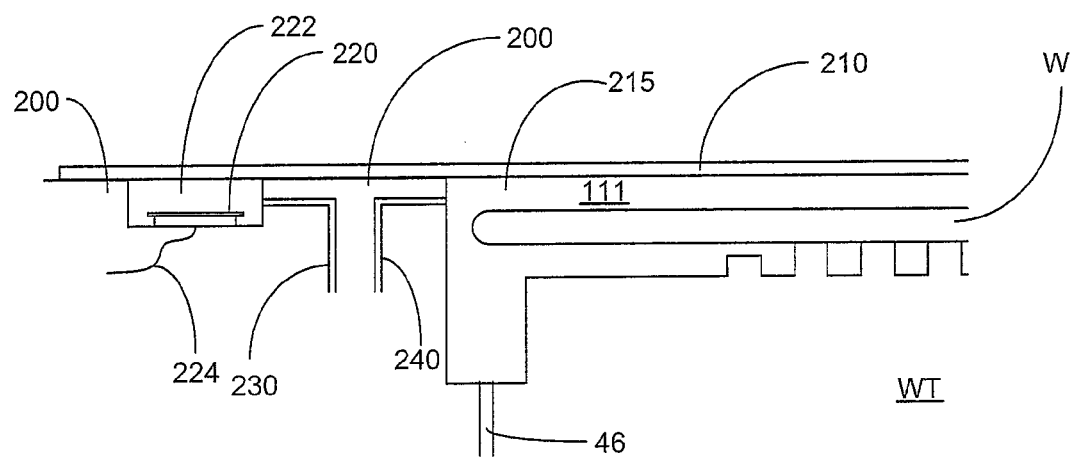
FIG. 17 illustrates a ninth embodiment of the present invention.

A ninth embodiment will be described with reference to FIG. 17. The solution shown in FIG. 17 bypasses some of the problems associated with imaging edge portions of the substrate W as well as allows a transmission image sensor (TIS) 220 (or other sensor) to be illuminated by the projection system PL under the same conditions as the substrate W.

The ninth embodiment uses the liquid supply system described with respect to the first embodiment. However, rather than confining the immersion liquid in the liquid supply system under the projection system PL on its lower side with the substrate W, the liquid is confined by an intermediary plate 210 which is positioned between the liquid supply system and the substrate W. The spaces 222, 215 between the intermediary plate 210 and the TIS 220 and the substrate W are also filled with liquid 111. This may either be done by two separate space liquid supply systems via respective ports 230, 240 as illustrated or by the same space liquid supply system via ports 230, 240. Thus the space 215 between the substrate W and the intermediary plate 210 and the space 222 between the transmission image sensor 220 and the intermediary plate 210 are both filled with liquid and both the substrate W and the transmission image sensor can be illuminated under the same conditions. Portions 200 provide a support surface or surfaces for the intermediary plate 210 which may be held in place by vacuum sources.

The intermediary plate 210 is made of such a size that it covers all of the substrate W as well as the transmission image sensor 220. Therefore, no edges need to be traversed by the liquid supply system even when the edge of the substrate W is imaged or when the transmission image sensor is positioned under the projection system PL. The top surface of the transmission image sensor 220 and the substrate W are substantially co-planar.

The intermediate plate 210 can be removable. It can, for example, be put in place and removed by a substrate handling robot or other appropriate mechanism.

Embodiment 10

Figure 18:
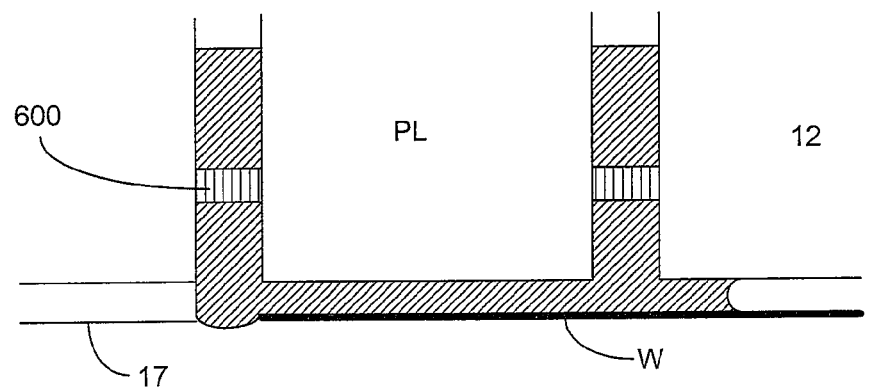
FIG. 18 illustrates a tenth embodiment of the present invention.

FIG. 18 shows a modification of the liquid supply system which is applicable to any other embodiment described herein which is effective to increase the size of gap the immersion liquid can span before sudden liquid loss.

A plurality of capillaries 600 are provided between the liquid supply system (e.g. seal member 12) and the projection system PL. These capillaries extend generally upwardly, i.e. away from the substrate W. If the capillaries have a radius r, the liquid film thickness h, which can be supported by the capillary, is given by the formula:

$$h = \frac{2\sigma \cos\theta}{rg\rho}$$

where σ is the interfacial tension, θ the contact angle between the liquid and the capillaries W and ρ the liquid density. Thus by making cos θ positive (i.e. making the inner surface of the capillaries hydrophobic, for example by a coating) the capillaries can support a portion of liquid with height h above the gap so that a larger gap can be spanned.

By applying a voltage between the hydrophobic coated capillaries and the liquid, cos θ can be reduced to around zero and this allows free flow of liquid through the capillaries 600 (according to equation 1 above) so that liquid can be removed from the liquid supply system under the projection system PL in little time by keeping the length of the capillaries low. This is advantageous for keeping the liquid clean. When the edge of the substrate W is imaged, the voltage can be removed so that the gap can be spanned. In order to lift the liquid film from the substrate W, it is proposed to coat the substrate W edges with a hydrophobic material (or the resist on the substrate W edges can be removed as the substrate material itself is hydrophobic).

The capillaries 600 may be provided by substantially straight ducts with a substantially circular cross-section or by other shaped ducts. For example, the capillaries may be made up of voids in a porous material.

Embodiment 11

Figure 19:
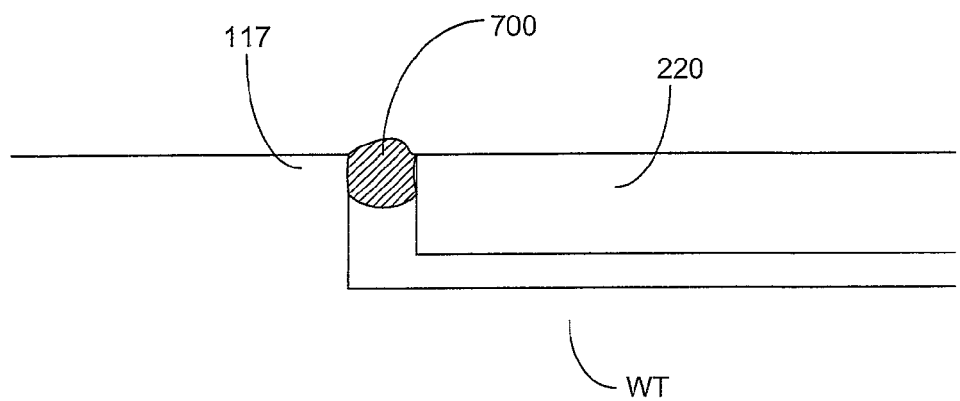
FIG. 19 illustrates an eleventh embodiment of the present invention.

FIG. 19 shows an eleventh embodiment which is the same as the first embodiment except as described below.

In the eleventh embodiment the object on the substrate table WT is a sensor 220 such as a transmission image sensor (TIS). In order to prevent immersion liquid seeping underneath the sensor 220, a bead of glue 700 which is undissolvable and unreactable with the immersion fluid is positioned between the edge seal member 117 and the sensor 220. The glue is covered by immersion fluid in use.

Embodiment 12

A twelfth embodiment is described with reference to FIGS. 20 and 21. In the twelfth embodiment it is a sensor 220 which is being sealed to the substrate table WT. In both versions illustrated in FIGS. 20 and 21, a vacuum 46 is provided adjacent the gap with an opening passage 47 and a chamber 44 for taking away any immersion liquid which should find its way through the gap between the edge seal member 117 and the edge of the sensor 220.

Figure 20:
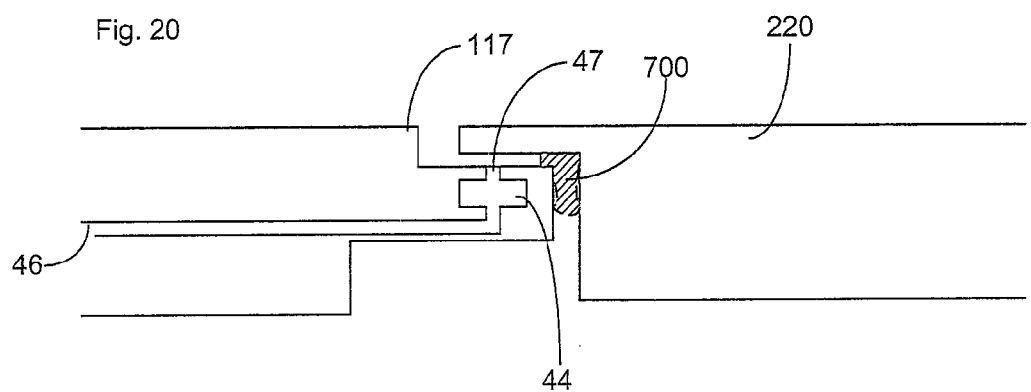
FIG. 20 illustrates a twelfth embodiment of the present invention.

In the FIG. 20 version, the vacuum 46 is provided in the substrate table WT under an overhang portion of the object 220. The passage 47 is provided in an overhanging inwardly protruding portion of the substrate table WT. Optionally a bead of glue 700 is positioned at the inner most edge of the protruding portion between the substrate table WT and the object 220. If no bead of glue 700 is provided, a flow of gas from underneath the object 220 helps seal the gap between the sensor 220 and the substrate table WT.

Figure 21:
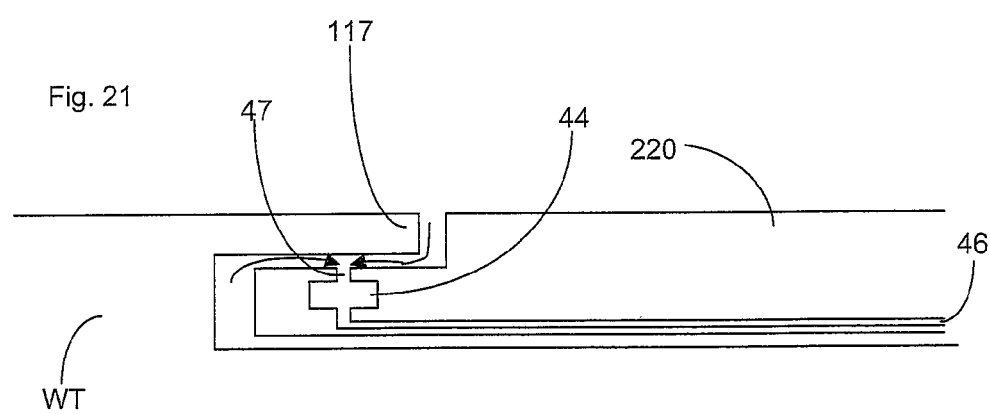
FIG. 21 illustrates a thirteenth embodiment of the present invention.

In the version of FIG. 21, the vacuum 46, compartment 44 and passage 47 are provided in the object 220 itself under an inwardly protruding edge seal member 117. Again there is the option of providing a bead of glue between the object 220 and the substrate table WT radially outwardly of the passage 47.

All of the above described embodiments may be used to seal around the edge of the substrate W. Other objects on the substrate table WT may also need to be sealed in a similar way, such as sensors including sensors and/or marks which are illuminated with the projection beam through the liquid such as a transmission image sensor, an integrated lens interferometer and scanner (wavefront sensor) and spot sensor plates. Such objects may also include sensors and/or marks which are illuminated with non-projection radiation beams such as levelling and alignment sensors and/or marks. The liquid supply system may supply liquid to cover all of the object in such a case. Any of the above embodiments may be used for this purpose. In some instances, the object will not need to be removed from the substrate table WT as, in contrast to the substrate W, the sensors do not need to be removed from the substrate table WT. In such a case the above embodiments may be modified as appropriate (e.g. the seals may not need to be moveable).

Each of the embodiments may be combined with one or more of the other embodiments as appropriate. Further, each of the embodiments (and any appropriate combination of embodiments) can be applied simply to the liquid supply system of FIG. 2 and FIGS. 19 and 20 without the edge seal member 17, 117 as feasible and/or appropriate.

The shape of the edge seal member 117 and the top outer most edge of the sensor 220 can be varied. For example, it may be advantageous to provide an overhanging edge seal member 117 or indeed an outer edge of the sensor 220 which is overhanging. Alternatively, an outer upper corner of the sensor 220 may be useful.

While specific embodiments of the invention have been described above, it will be appreciated that the invention may be practiced otherwise than as described. In particular, the invention is also applicable to other types of liquid supply systems, especially localized liquid area systems. If the seal member solution is used, it may be one in which a seal other than a gas seal is used. The description is not intended to limit the invention.

The invention claimed is:

1. A lithographic projection apparatus comprising:
   a projection system configured to project a patterned beam onto a target portion of a substrate; and
   a substrate table configured to hold the substrate, the substrate table comprising:
      an edge seal member configured to at least partly surround an edge of the substrate, an object positioned on the substrate table, or both, and
      a port positioned to remove fluid from a gap between the edge seal member and the substrate, the object, or both, and positioned at a side of the gap opposite the projection system and below the substrate, the object, or both; and
   a liquid supply system configured to provide a liquid, through which the beam is to be projected, in a space between the projection system and the substrate, the object, or both, the liquid supply system comprising an inlet, located above the substrate table, to supply the liquid to the space.

2. The apparatus according to claim 1, wherein the substrate table further comprises a channel positioned radially inwardly of the port, the channel being connected to a gas source such that on removal of fluid through the port a flow of gas radially outwardly from the channel towards the port can be established.

3. The apparatus according to claim 2, wherein one or more burls configured to be in contact with the substrate, the object, or both, are present radially outwardly of the channel and inwardly of the port.

4. The apparatus according to claim 1, wherein the substrate table comprises a portion which extends below the substrate, the object, or both, and is radially outwardly of the port.

5. The apparatus according to claim 4, wherein the portion has one or more parts which extend up to the substrate, the object, or both, to at least partly support the substrate, the object, or both.

6. The apparatus according to claim 4, wherein the portion is part of a pimple table which supports the substrate.

7. The apparatus according to claim 1, further comprising a compartment in the substrate table in fluid connection with the gap via the port and with a suction source.

8. The apparatus according to claim 1, wherein the port is annular.

9. The apparatus according to claim 1, wherein the port is discontinuous.

10. The apparatus according to claim 1, wherein the port is continuous.

11. The apparatus according to claim 1, wherein the port is positioned adjacent an edge portion of the edge seal member.

12. The apparatus according to claim 1, wherein the object comprises a sensor.

13. The apparatus according to claim 1, wherein the edge seal member is glued to the substrate, the object, or both, around a periphery of the substrate, the object, or both.

14. A device manufacturing method, comprising:
providing a liquid in a space between a projection system and a substrate, an object, or both, using an inlet located above the substrate, the object, or both, wherein an edge of the substrate, the object, or both, is at least partly surrounded by a body;
projecting a patterned beam of radiation, through a liquid, onto a portion of the substrate, the object, or both; and
removing fluid from a gap between the body and the substrate, the object, or both, using a port positioned at a side of the gap opposite the projection system and below the substrate, the object, or both.

15. The method of claim 14, further comprising establishing a flow of gas radially outwardly from a channel, positioned radially inwardly of the port, towards the port.

16. The method of claim 14, wherein a portion of a movable table to support the substrate, the object, or both extends below the substrate, the object, or both, and is radially outwardly of the port.

17. The method of claim 16, wherein the portion has one or more parts which extend up toward the substrate, the object, or both.

18. The method of claim 17, wherein the portion is part of a pimple table which supports the substrate.

19. The method of claim 14, comprising removing the fluid using the port via a compartment in a movable table in fluid connection with a suction source.

20. The method of claim 14, wherein the port is annular.

21. The method of claim 14, wherein the port is discontinuous.

22. The method of claim 14, wherein the port is continuous.

23. The method of claim 14, wherein the port is positioned adjacent an edge portion of the body.

24. The method of claim 14, wherein the object comprises a sensor.

25. The method of claim 14, wherein the body is separable from a movable table supporting the substrate, the object, or both, and is movable relative to the substrate, the object, or both.

26. The method of claim 14, wherein providing the liquid comprises providing the liquid such that the liquid covers a cross-sectional area smaller than the area of the top surface of the substrate.

27. A lithographic projection apparatus comprising:
a projection system configured to project a patterned beam of radiation onto a target portion of a substrate, of a sensor, or both;
a movable table, comprising:
a body having an aperture to contain the substrate, the sensor, or both, therein, and
an outlet located below the substrate and/or sensor to remove liquid entering a gap between a lateral edge of the aperture and a lateral edge of the substrate and/or sensor; and
a liquid supply system configured to provide a liquid, through which the beam is to be projected, in a space between the projection system and the table, the liquid supply system comprising an inlet, located above the substrate table, to supply the liquid to the space.

28. The apparatus according to claim 27, wherein the liquid supply system further comprises a liquid confinement structure positioned adjacent a final surface of the projection system and extending along at least a part of a boundary of the space, wherein, when the liquid is in the space, the cross-sectional area of the liquid in the space is smaller than the area of the substrate.

29. The apparatus according to claim 27, wherein the table further comprises a channel positioned radially inwardly of the outlet.

30. The apparatus according to claim 27, wherein the outlet is located in a groove in the table.

31. The apparatus according to claim 30, wherein the groove is annular.

32. The apparatus according to claim 27, wherein the outlet is discontinuous.

33. The apparatus according to claim 27, wherein the body is separable from the table and movable relative to the substrate, the sensor, or both.

* * * * *

UNITED STATES PATENT AND TRADEMARK OFFICE
CERTIFICATE OF CORRECTION

PATENT NO. : 8,558,989 B2
APPLICATION NO. : 12/850472
DATED : October 15, 2013
INVENTOR(S) : Joeri Lof et al.

It is certified that error appears in the above-identified patent and that said Letters Patent is hereby corrected as shown below:

On title page, Item (75) Inventors
in line 5, replace "'S-Hertogenbosch"
with --'s-Hertogenbosch-- in line 8, replace "Nijmegen"
with --Helmond-- in line 17, replace "'S-Hertogenbosch"
with --'s-Hertogenbosch--.

Signed and Sealed this
Eleventh Day of February, 2014

Michelle K. Lee
*Deputy Director of the United States Patent and Trademark Office*